United States Patent
Atmaca

(10) Patent No.: US 12,154,982 B2
(45) Date of Patent: Nov. 26, 2024

(54) GALLIUM NITRIDE TRANSISTOR

(71) Applicant: Commissariat à l'Énergie Atomique et aux Énergies Alternatives, Paris (FR)

(72) Inventor: Gökhan Atmaca, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 465 days.

(21) Appl. No.: 17/496,699

(22) Filed: Oct. 7, 2021

(65) Prior Publication Data
US 2022/0115528 A1    Apr. 14, 2022

(30) Foreign Application Priority Data

Oct. 9, 2020 (FR) ..................... 2010357

(51) Int. Cl.
| | |
|---|---|
| H01L 29/778 | (2006.01) |
| H01L 29/20 | (2006.01) |
| H01L 29/205 | (2006.01) |
| H01L 29/207 | (2006.01) |
| H01L 29/40 | (2006.01) |

(52) U.S. Cl.
CPC ...... *H01L 29/7787* (2013.01); *H01L 29/2003* (2013.01); *H01L 29/205* (2013.01); *H01L 29/207* (2013.01); *H01L 29/402* (2013.01)

(58) Field of Classification Search
None
See application file for complete search history.

(56) References Cited

U.S. PATENT DOCUMENTS

| | | |
|---|---|---|
| 2008/0149965 A1 | 6/2008 | Kaibara et al. |
| 2014/0097470 A1 | 4/2014 | Kim et al. |
| 2015/0270379 A1 | 9/2015 | Kuraguchi et al. |
| 2020/0185514 A1 | 6/2020 | Chen |

FOREIGN PATENT DOCUMENTS

EP     2 713 402 A2    4/2014

OTHER PUBLICATIONS

Preliminary Search Report for French Application No. 2010357, dated Jun. 23, 2021.
Efthymiou et al., On the physical operation and optimization of the p-GaN gate in normally-off GaN HEMT devices. Applied Physics Letters. Mar. 20, 2017;110(12):123502.
Hwang et al., p-GaN gate HEMTs with tungsten gate metal for high threshold voltage and low gate current. IEEE Electron Device Letters. Jan. 4, 2013;34(2):202-4.
Kawai et al., Low cost high voltage GaN polarization superjunction field effect transistors. physica status solidi (a). Aug. 2017;214(8):1600834.

(Continued)

*Primary Examiner* — Bo B Jang
(74) *Attorney, Agent, or Firm* — Wolf, Greenfield & Sacks, P.C.

(57) ABSTRACT

A transistor device including a layer of AlGaN extending between a source and drain of the device; a GaN channel layer extending under the AlGaN layer; a gate stack including a layer of p-doped gallium nitride; and a layer of p-doped InGaN of at least 5 nm in thickness positioned between the AlGaN layer and the p-doped gallium nitride layer, the InGaN layer having a length greater than a length of the gate stack.

13 Claims, 15 Drawing Sheets

(56) References Cited

OTHER PUBLICATIONS

Kim et al., High threshold voltage p-GaN gate power devices on 200 mm Si. Proceedings of the 25th International Symposium on Power Semiconductor Devices & IC's (ISPSD). May 26, 2013:315-318.
Mizutani et al., Normally off AlGaN/GaN high electron mobility transistors with p-InGaN cap layer. Journal of Applied Physics. Jan. 21, 2013;113(3):034502.
Uemoto et al., Gate injection transistor (GIT)—A normally-off AlGaN/GaN power transistor using conductivity modulation. IEEE Transactions on Electron Devices. Nov. 27, 2007;54(12):3393-9.

GALLIUM NITRIDE TRANSISTOR

CROSS-REFERENCE TO RELATED APPLICATION

This application claims priority to French patent application number 20/10357, filed on Oct. 9, 2020. The contents of which is incorporated herein by reference in its entirety.

TECHNICAL FIELD

The present disclosure relates generally to the field of electronic devices, and in particular to Gallium Nitride transistors.

BACKGROUND ART

Gallium Nitride (GaN) High Electron Mobility Transistors (HEMT) are of interest for high power applications in view of their relatively high breakdown field, high mobility and good thermal properties.

However, GaN HEMT devices are inherently normally on devices, having a negative threshold voltage Vth due to presence of the two-dimensional electron gas (2DEG) at the heterostructure interface. For power device applications, it is desirable to use normally off devices for safety reasons and system reliability.

The publication by I. Hwang et al. entitled "p-GaN Gate HEMTs With Tungsten Gate Metal for High Threshold Voltage and Low Gate Current", IEEE Electron device letters, Vol. 34, No. 2, February 2013, proposes to replace a gate metal of a GaN HEMT device with tungsten, as will now be described with reference to FIGS. 1 and 2.

FIG. 1 substantially reproduces FIG. 1 of the above publication. The HEMT device 100 comprises an AlGaN layer 102 formed on a GaN layer 104. A source region (S) 106 and a drain region (D) 108 are formed on the layer 102. A gate stack comprises a layer of p-doped GaN (p-GaN) 110 formed on the layer 102, and a gate metal (GATE) 112 formed on the layer 110. The gate stack is separated from the source 106 and drain 108 by nitride (SiN) 114.

FIG. 2 is a graph substantially reproducing FIG. 3 of the above publication. The graph plots drain current Id and gate current Ig as a function of gate voltage Vgs, and a logarithmic-scale plot is shown in the inset.

Curves 202 illustrate the drain current Id as a function of gate voltage Vgs for the HEMT device of FIG. 1, having a gate formed of nickel. The threshold voltage Vth is 1.23 V. Curves 203 illustrate corresponding gate currents.

Curves 204 illustrates the drain current Id as a function of gate voltage Vgs for the HEMT device of FIG. 1, having a gate formed of tungsten. The threshold voltage Vth has increased to 3.03 V. Curves 205 illustrate corresponding gate currents.

Thanks to its low workfunction, the use of tungsten as the gate metal significantly increases the transistor threshold voltage Vth. However, this is at the cost of a significant reduction in the drain current Id. For example, as represented by a dashed line 206 in FIG. 2, at a gate voltage Vgs of 7 V (highest value covered by both curves in FIG. 2), the drain current Id in the case of the tungsten gate is less than 50% of that of the comparable nickel device.

There is a need in the art to provide an HEMT device having a relatively high threshold voltage while maintaining a relatively high drain current.

SUMMARY OF INVENTION

It is an aim of embodiments of the present disclosure to at least partially address one or more needs in the art.

According to one aspect, there is provided a transistor device comprising: a layer of AlGaN extending between a source and drain of the device; a GaN channel layer extending under the AlGaN layer; a gate stack comprising a layer of p-doped gallium nitride; and a layer of p-doped InGaN of at least 5 nm in thickness positioned between the AlGaN layer and the p-doped gallium nitride layer, the InGaN layer having a length greater than a length of the gate stack.

According to one embodiment, a drain-side edge of the p-doped InGaN layer is separated from the drain and/or a source-side edge of the p-doped InGaN layer is separated from the source.

According to one embodiment, the length of the layer of p-doped InGaN is greater than a length of the p-doped gallium nitride layer.

According to one embodiment, the layer of p-doped InGaN has a length of at least 6 μm.

According to one embodiment, the layer of p-doped InGaN has an Mg doping concentration of at least $5 \times 10^{18}$ cm$^{-3}$, and for example of at least $7.5 \times 10^{18}$ cm$^{-3}$.

According to one embodiment, the layer of p-doped InGaN has an Mg doping concentration of less than $1 \times 10^{19}$ cm$^{-3}$.

According to one embodiment, the layer of p-doped InGaN has an In mole fraction of at least 0.05, and for example of between 0.10 and 0.20.

According to one embodiment, the p-doped InGaN layer extends beyond a drain-side edge of the gate stack by at least 2.0 μm, the p-doped InGaN layer for example being aligned on the source side with a source-side edge of the gate stack.

According to one embodiment, a drain-side edge of the p-doped InGaN layer is separated from the drain by a spacing of at least 4.0 μm.

According to one embodiment, the gate stack comprises a gate metal of Ni, W, or TiN.

According to one embodiment, the layer of p-doped InGaN has a thickness of 7.5 nm or less.

According to one embodiment, the transistor device comprises a source field plate extending from the source over the gate stack.

According to one aspect, there is provided an integrated circuit comprising at least one transistor device as above.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, methods of fabricating a p-GaN HEMT device are well known in the art, and have not been described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

As described in the background section above, the use, in a conventional HEMT device, of a gate formed of a metal having a low workfunction can provide an increase in the threshold voltage, but at the cost of a significant reduction in the drain current.

To increase the drain current in a p-GaN gate HEMT, the so-called hole injection phenomena could be useful, as discussed for example in the publication by L. Efthymiou et al. entitled "On the physical operation and optimization of the p-GaN gate in normally-off GaN HEMT devices", Appl. Phys. Lett., vol. 110, 123502, March 2017. However, hole injection can only occur when Mg concentrations that are higher than $5 \times 10^{18}$ cm$^{-3}$ are used in the p-GaN gate. With such a solution, the drain current increases, but the threshold voltage Vth also decreases due to the additional electron accumulation in the channel owing to the hole injection.

Figure 1:
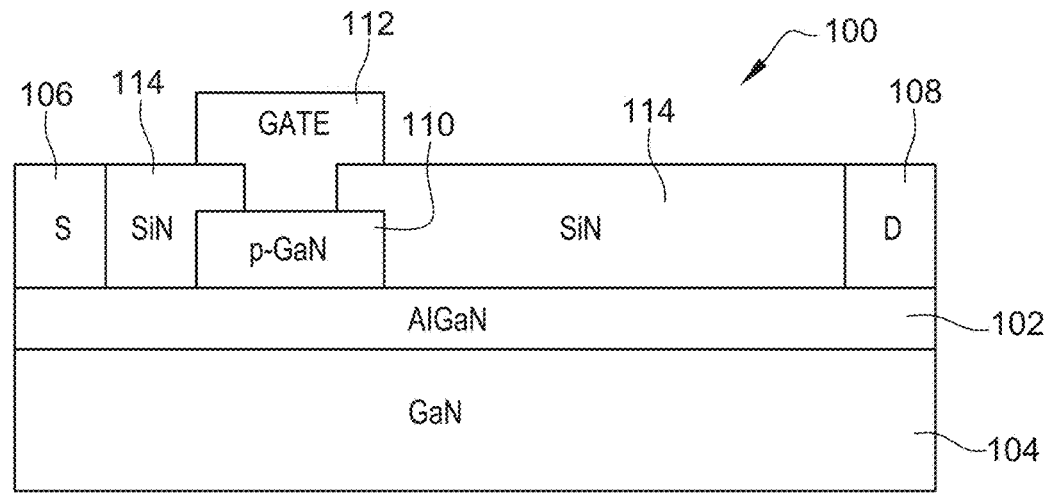
FIG. 1 (described above) is a cross-section view of a device described in the publication by I. Hwang et al. cited in the background section.
Figure 2:
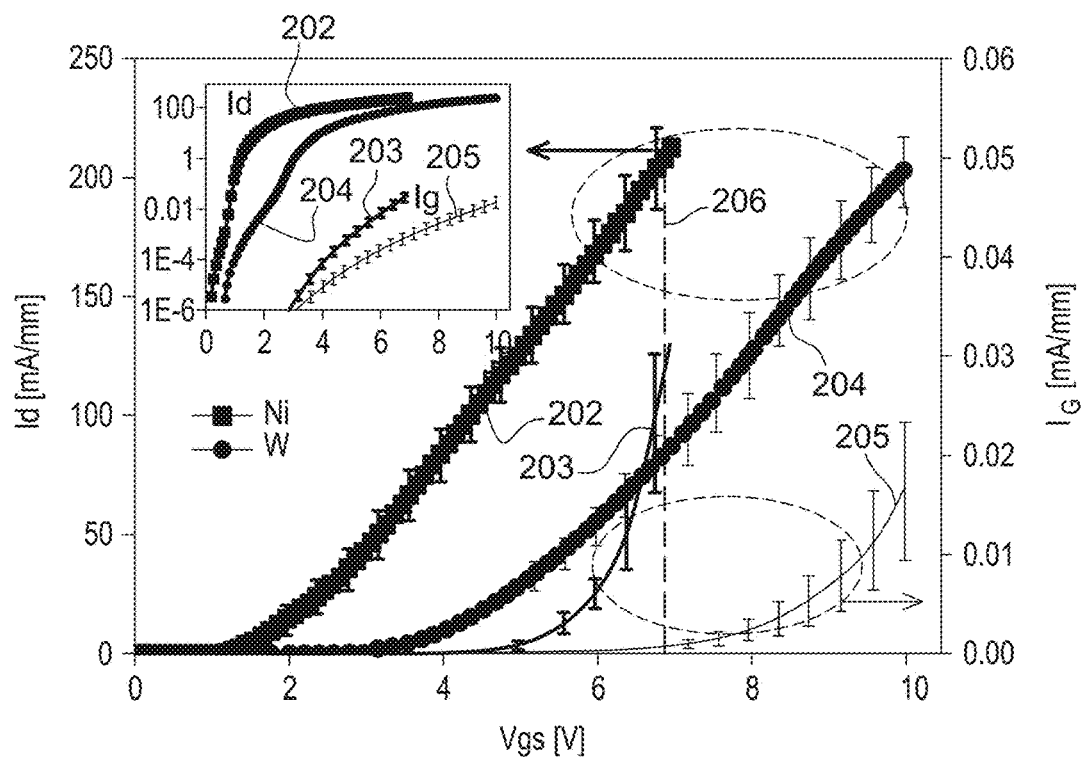
FIG. 2 is a graph plotting drain current Id and gate current Ig as a function of gate voltage Vgs for the device of FIG. 1 with nickel and tungsten gates.
Figure 3:
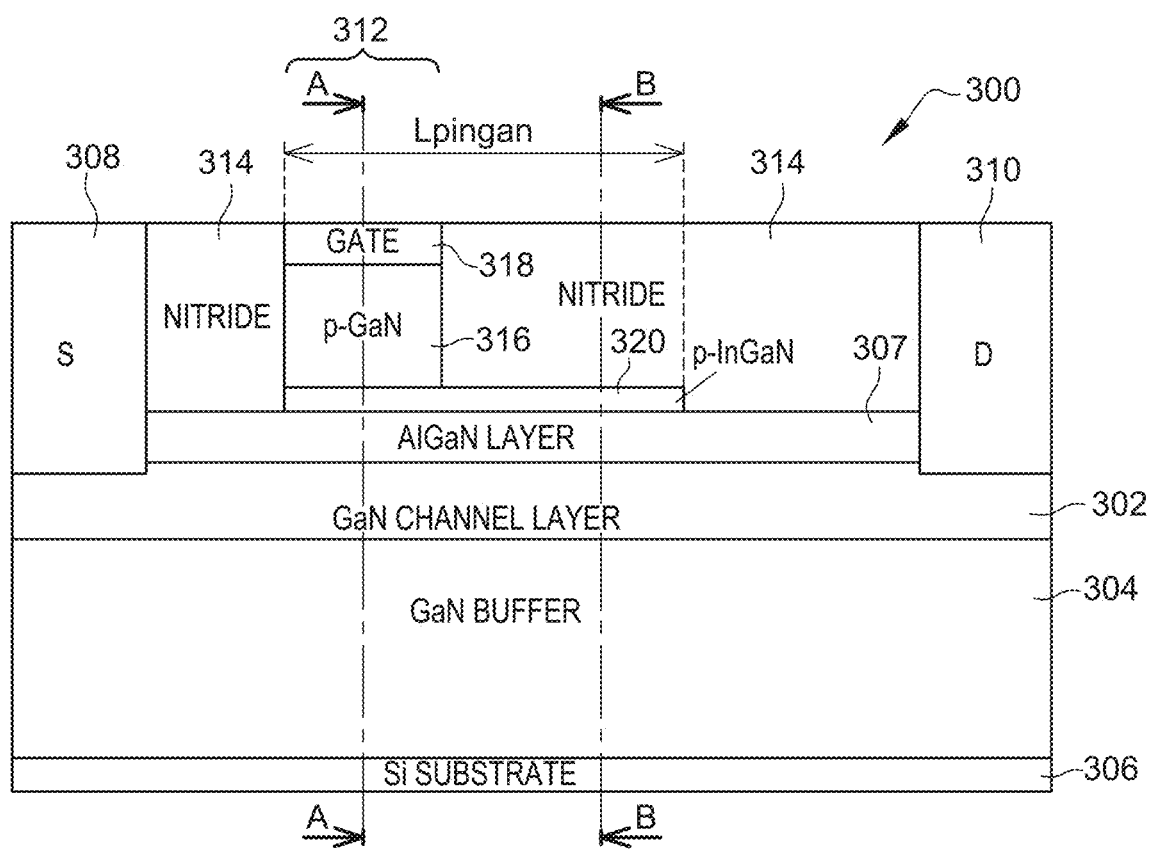
FIG. 3 is a cross-section view of an HEMT device according to an example embodiment of the present disclosure.

FIG. 3 is a cross-section view of an HEMT device 300 according to an embodiment of the present disclosure. A GaN channel layer (GaN CHANNEL LAYER) 302 is for example formed on a GaN buffer layer (GaN BUFFER) 304, which is in turn formed, for example, on a silicon substrate (Si SUBSTRATE) 306. The GaN channel layer 302 for example has a thickness of 200 nm, or of substantially 200 nm. In the example of FIG. 3, the AlGaN layer (AlGaN LAYER) 307 is formed on the GaN channel layer 302 and between the source (S) 308 and drain (D) 310 of the device. However, in alternative embodiments it would also be possible for the source and drain to be formed on the AlGaN layer 307, like in the example of FIG. 1. The AlGaN layer 307 is for example an $Al_{0.25}Ga_{0.75}N$ barrier layer having a thickness of 15 nm or of substantially 15 nm.

A gate stack 312 of the device is separated from the source 308 and drain 310 by regions 314 of nitride (NITRIDE). The gate stack 312 comprises a p-GaN layer 316, which for example has an Mg concentration of $1\times10^{19}$ cm$^{-3}$ and a thickness of 70 nm or of substantially 70 nm. The gate stack 312 also comprises a gate metal (GATE) 318 formed over the layer 316. For example, the gate metal is Ni with a metal workfunction of 5.2 eV.

The device 300 further comprises a layer 320 of p-doped InGaN (p-InGaN) positioned between the p-GaN layer 316 of the gate stack 312 and the AlGaN layer 307. The layer 320 for example has a length Lpingan that is greater than the length of the gate stack 312, such that the layer 320 extends under the nitride layer 314 on at least one side of the gate stack 312. A contact area between the layer 320 and the layer 307 is thus for example greater than a contact area between the layer 320 and the layer 316 of the gate stack 312.

The p-InGaN layer 320 for example has an Mg concentration of $1\times10^{19}$ cm$^{-3}$ in the example of FIG. 3 and a thickness of 7.5 nm.

The p-GaN layer 316 and the p-InGaN layer 320 are for example grown on an AlGaN/GaN heterostructure. These layers 316, 320 can for example be formed by the selective inductively-coupled plasma reactive-ion etching (ICP-RIE) method. Firstly, the p-GaN layer 316 and p-InGaN layer 320 are removed between Lpingan and the drain 310. During etching, due to poor etch controllability, some parts of p-InGaN layer may be etched a little more. However, the thickness of the p-InGaN layer 320 can still ensure the same device operation as the intended device.

Advantageously, the p-InGaN layer 320 leads to an increase in the threshold voltage Vth owing to the fact that it raises the conduction band energy at the heterointerface in the access region. Furthermore, the p-InGaN layer 320 increases the drain current of the device thanks to the hole injection phenomena. This will now be described in more detail with reference to FIGS. 4 to 6.

Figure 4A:
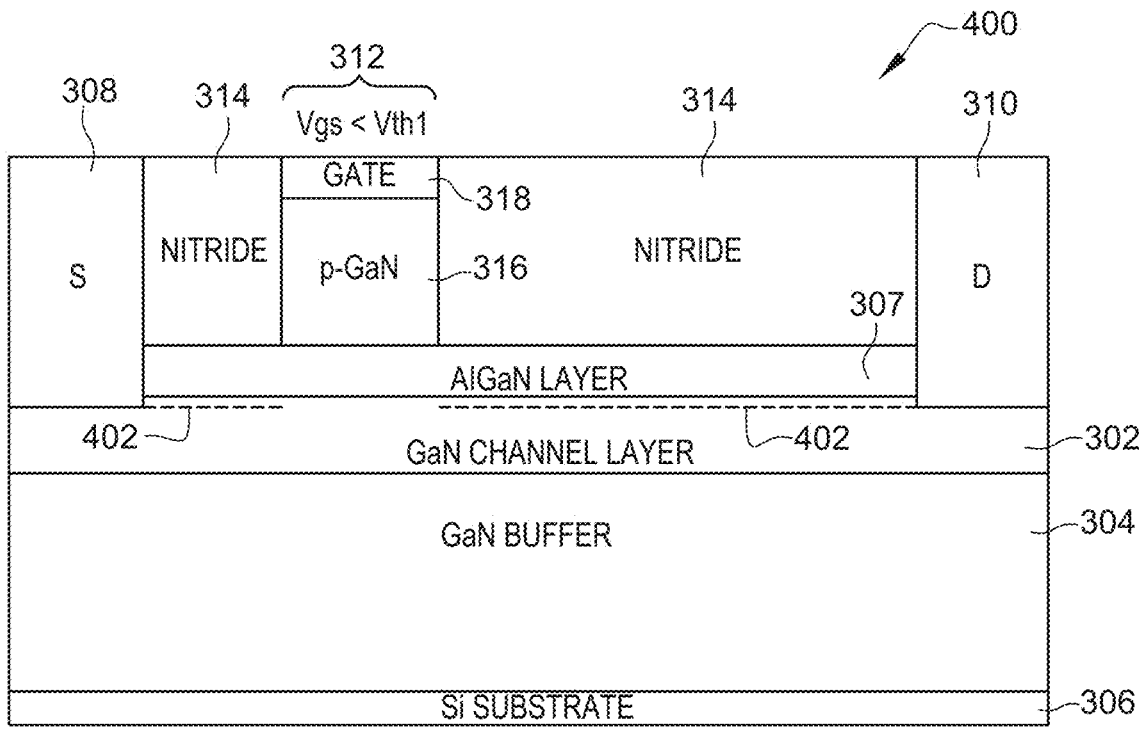
FIG. 4A is a cross-section view of an HEMT device without any layer of p-InGaN for a gate voltage Vgs below the threshold voltage Vth1 of the device.

FIG. 4A is a cross-section view of a reference HEMT device 400, which has the same structure as the device 300 of FIG. 3, but without the p-InGaN layer 320. Other layers and regions of the device 400 have been labelled with the same reference numerals as the device 300, and will not be described again in detail.

In FIG. 4A, it is assumed that the gate voltage Vgs applied to the gate metal 318 is lower than a threshold voltage Vth1 of the device 400, which is for example of between 0 V and 1 V. In such a case, a 2DEG depletion in the channel 302 occurs under the gate stack 312 as represented by an interruption in a dashed line 402 extending under the AlGaN layer 307. The depletion of 2DEG is for example limited only by the gate length over the p-GaN layer 316.

Figure 4B:
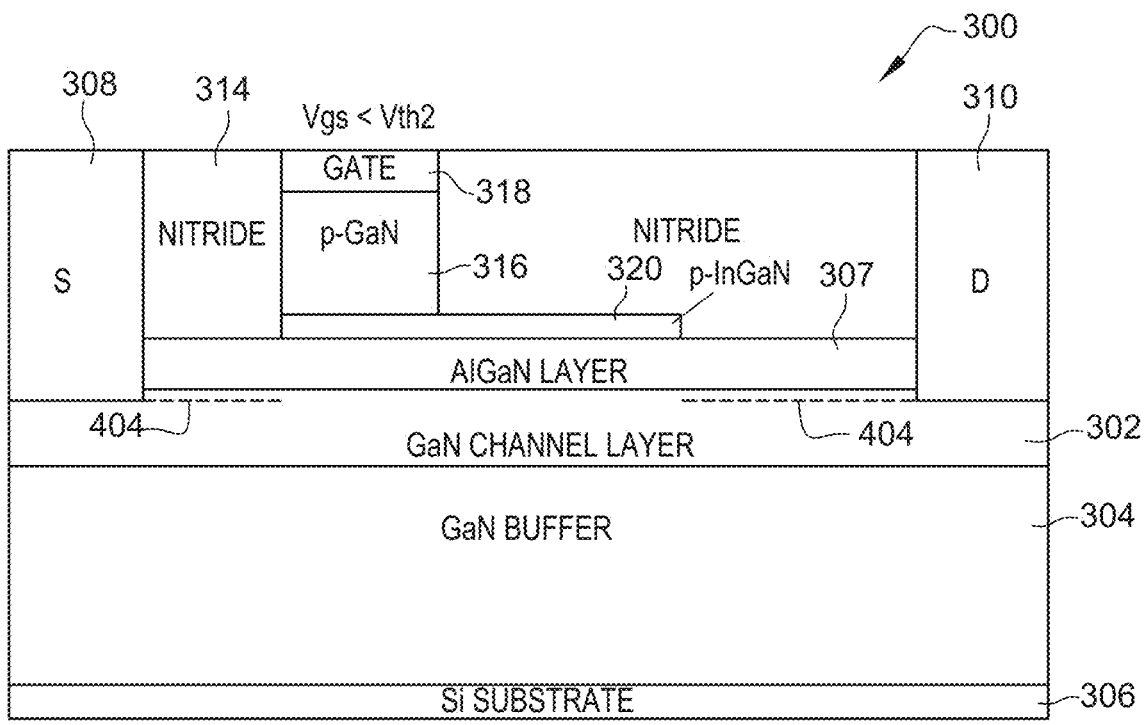
FIG. 4B is a cross-section view of the HEMT device of FIG. 3 for a gate voltage Vgs below the threshold voltage Vth2 of the device.

FIG. 4B is a cross-section view of the HEMT device 300 of FIG. 3 for a gate voltage Vgs below the threshold voltage Vth2 of the device 400. This threshold voltage Vth2 is significantly greater than the threshold voltage Vth1 of the device 400. Indeed, as represented by an interruption in a dashed line 404 in FIG. 4B, the p-InGaN layer 320 leads to an increase in the area of the 2DEG depletion in the channel in comparison to the reference device 400 as the layer 320 in the access region lifts the conduction energy band. The DEG depletion has been found in fact to extend over the area under the layer 320, rather than only under the gate stack 312. This leads to the increase in the threshold voltage of the device.

Figure 5A:
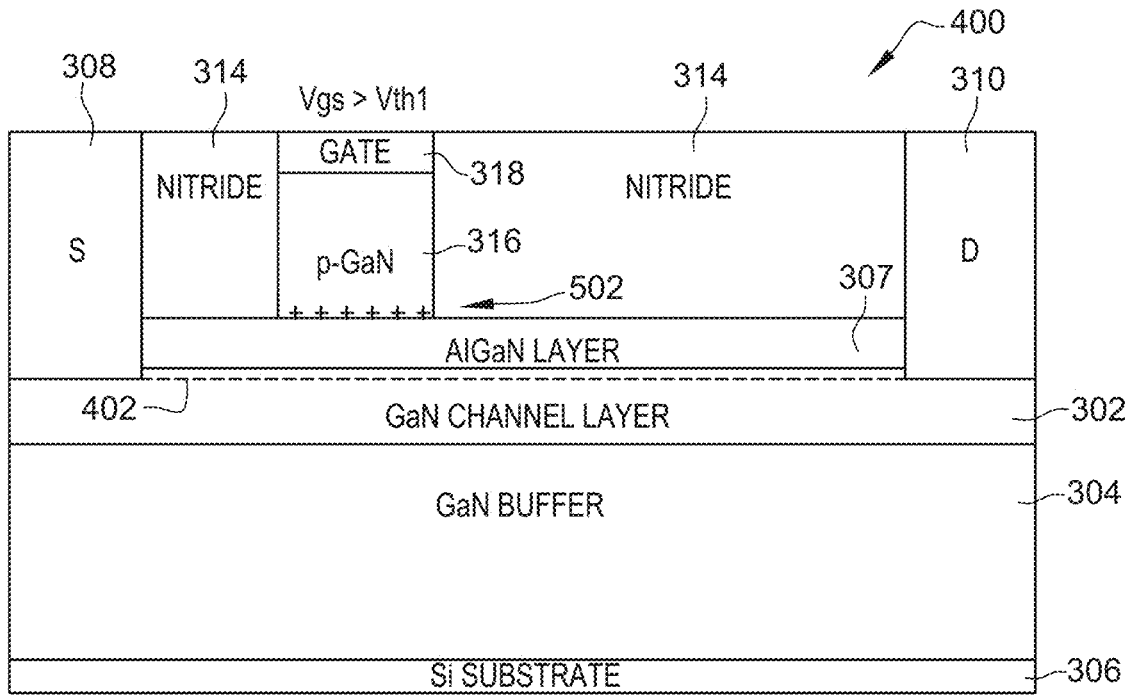
FIG. 5A is a cross-section view of the device of FIG. 4A for a gate voltage Vgs greater than a threshold voltage Vth1 of the device.

FIG. 5A is a cross-section view of the device 400 of FIG. 4A for a gate voltage Vgs greater than the threshold voltage Vth1 of the device 400. As the gate bias increases, a 2DHG (2-Dimensional Hole Gas) occurs at the p-GaN/AlGaN interface, as represented by a row 502 of "+" signs. The 2DEG depletion 402 in the channel 302 now extends the length of the AlGaN layer 307.

Figure 5B:
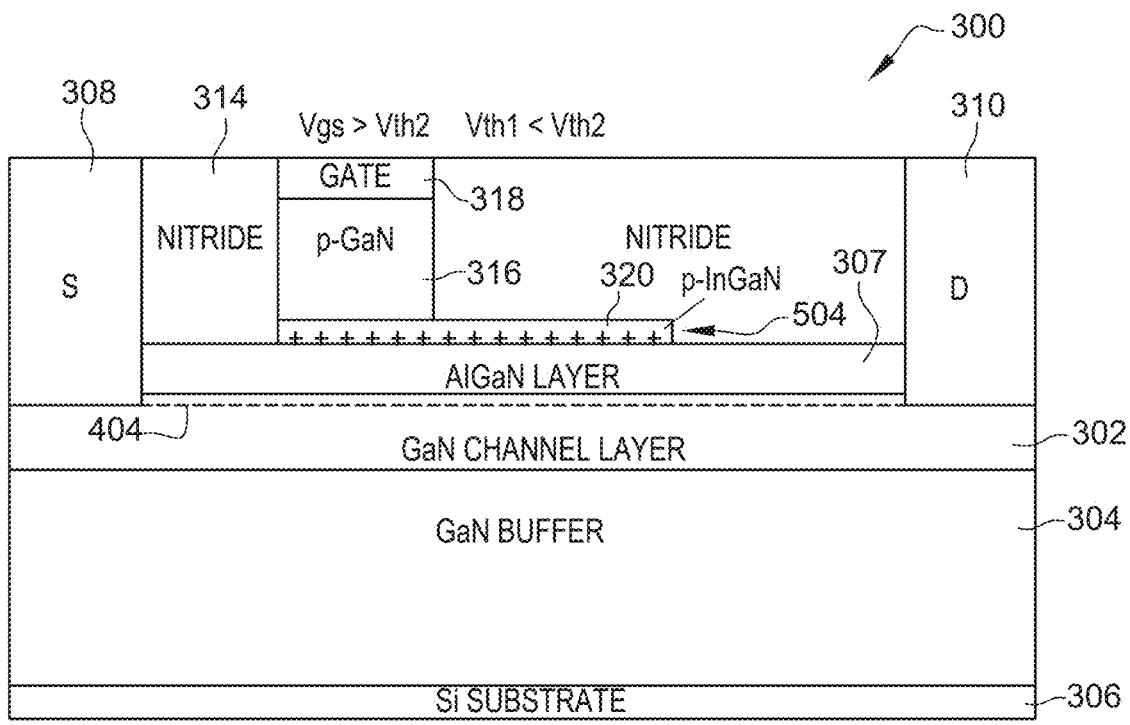
FIG. 5B is a cross-section view of the HEMT device of FIG. 3 for a gate voltage Vgs greater than the threshold voltage Vth2 of the device.

FIG. 5B is a cross-section view of the HEMT device of FIG. 3 for a gate voltage Vgs greater than the threshold voltage Vth2 of the device. As the gate bias increases, a 2DHG occurs at the p-InGaN/AlGaN interface, as represented by a row 504 of "+" signs. Thus, the area of 2DHG is greater than in the reference device 400. Like in the reference device, the 2DEG depletion 404 in the channel 302 now extends the length of the AlGaN layer 307.

Figure 6A:
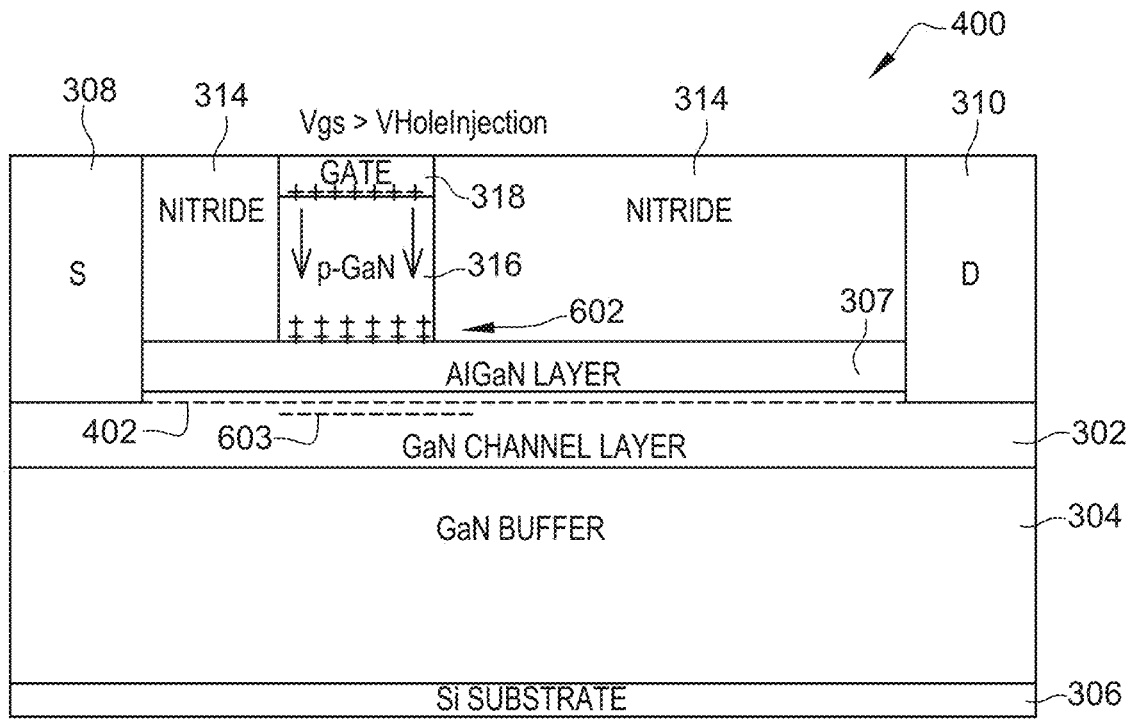
FIG. 6A is a cross-section view of the device of FIG. 4A for a gate voltage Vgs greater than a hole injection voltage VHoleInjection of the device.

FIG. 6A is a cross-section view of the device 400 of FIG. 4A for a gate voltage Vgs greater than a hole injection voltage VHoleInjection of the device at which hole injection begins. The injected holes are a result of hole barrier tunneling in the layer 316, and cause an increase in the 2DHG density at the interface between the p-GaN layer 316 and the AlGaN layer 307, as represented by a double row 602 of "+" signs, leading to an accumulation of electrons in the channel represented by a dashed line 603.

Figure 6B:
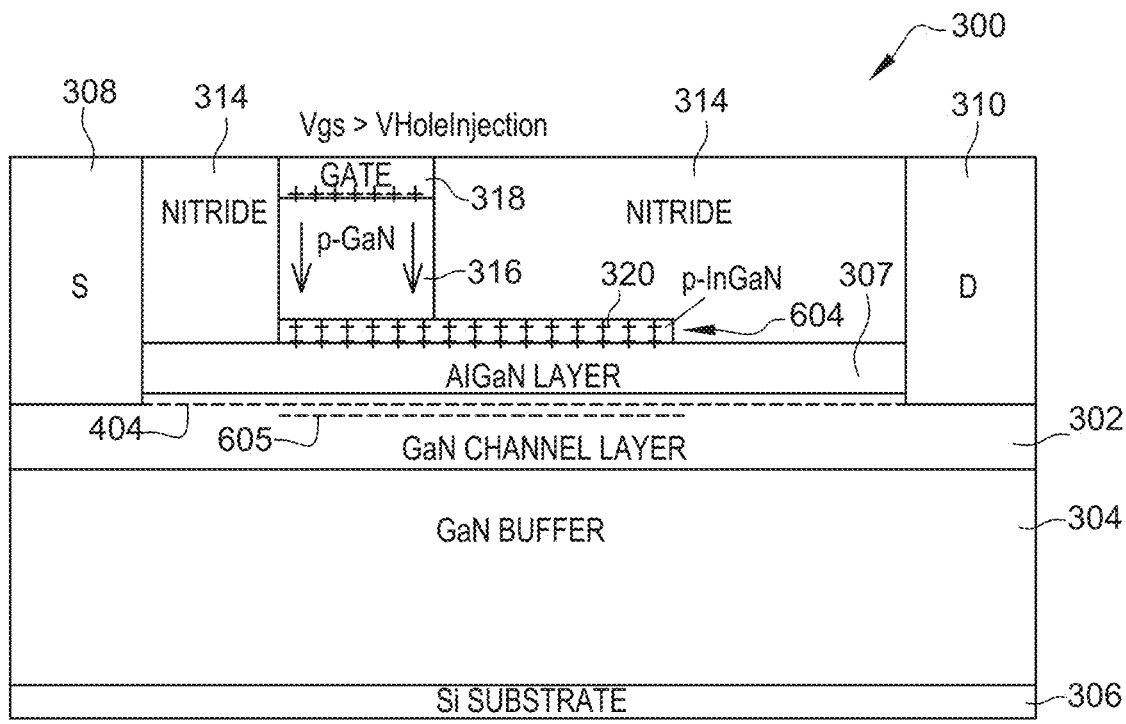
FIG. 6B is a cross-section view of the HEMT device of FIG. 3 for a gate voltage Vgs greater than a hole injection voltage VHoleInjection of the device.

FIG. 6B is a cross-section view of the HEMT device 300 of FIG. 3 for a gate voltage Vgs greater than the hole injection voltage VHoleInjection of the device at which hole injection begins. For example, the voltage VHoleInjection of this device is between 4 and 5 V. This voltage for example depends on the metal/p-InGaN layer interface, and is thus for example similar to that of the reference device. In this case, the injected holes increase the 2DHG density along the area of 2DHG, cross the p-InGaN layer 320, as represented by a double row 604 of "+" signs. Furthermore, as represented by a dashed line 605, this leads to a greater accumulation of electrons in the channel than in the case of the reference device 400.

Performance of the device 300 of FIG. 3 with respect to the device 400 of FIG. 4A will now be described in more detail with reference to graphs of FIGS. 7 to 10. These comparisons assume an Mg concentration of $1\times10^{19}$ cm$^{-3}$ and an Ni gate metal in each of the devices. Furthermore, they assume that the device 300 has a p-InGaN layer 320 of length Lpingan=5 μm.

Figure 7A:
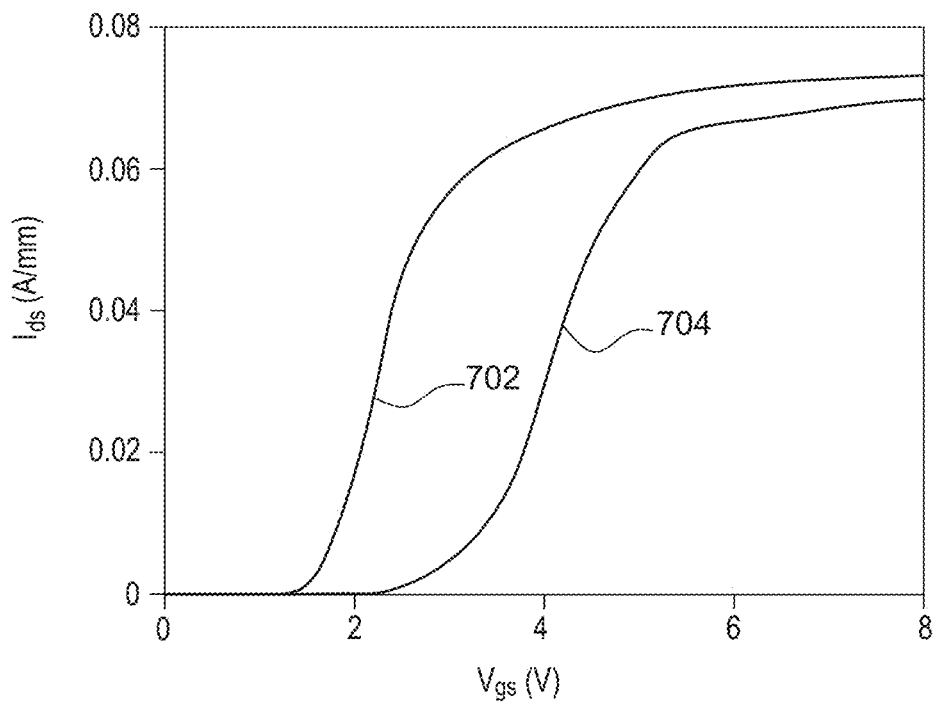
FIG. 7A is a graph representing a drain-source current Ids of the devices of FIGS. 3 and 4A.

FIG. 7A is a graph representing a drain-source current Ids of the device 400 of FIG. 4A (curve 702) and of the device 300 of FIG. 3 (curve 704) as a function of the gate-source voltage Vgs. These curves assume a drain-source voltage Vds of 1 V. In the case of the reference device 400, the threshold voltage Vth is 1.45 V due to p-type doping in the p-GaN layer 316. The drain current at a Vgs of 8 V is 91.3 mA/mm. In the case of the device 300, the threshold voltage Vth is increased to 2.45 V. The drain current at a Vgs of 8 V is 87.1 mA/mm, which is a relatively small decrease with respect to the reference device 400.

Figure 7B:
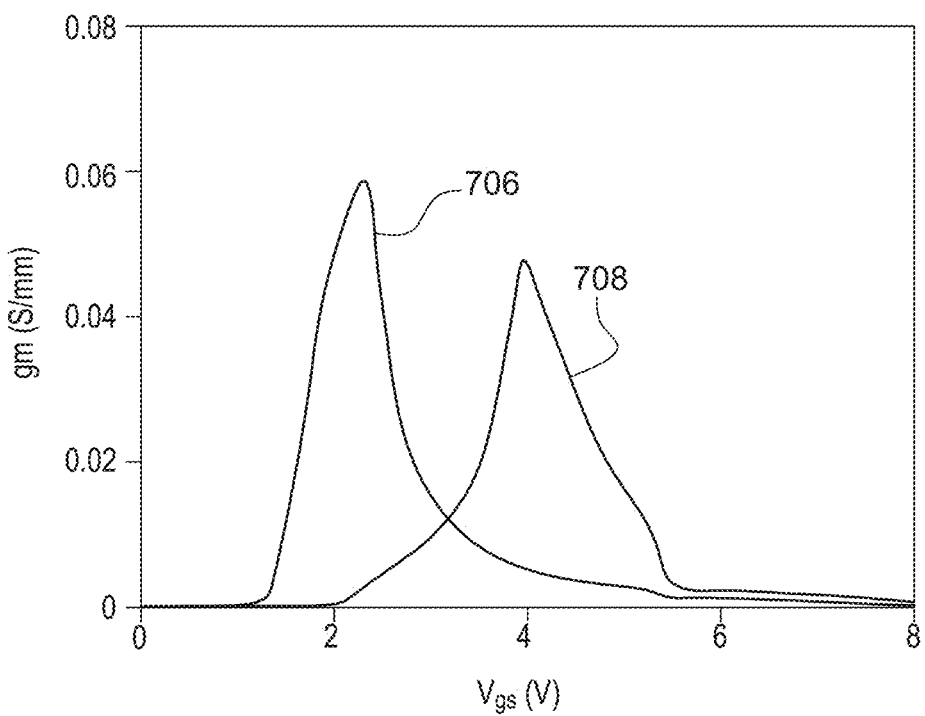
FIG. 7B is a graph representing a transconductance gm of the devices of FIGS. 3 and 4A.

FIG. 7B is a graph representing a transconductance gm of the device 400 of FIG. 4A (curve 706) and of the device 300 of FIG. 3 (curve 708). It will be noted that a maximum transconductance of the device 300 is reduced in comparison with the device 400 due to positive charges at the p-InGaN/AlGaN interface resulting in depleted 2DEG electrons in the access region. Indeed, p-type doping in p-InGaN layer 320 raises the conduction band energy at AlGaN/GaN interface even under the nitride layer 314, resulting in depleted 2DEG electrons in the same region.

Figure 8A:
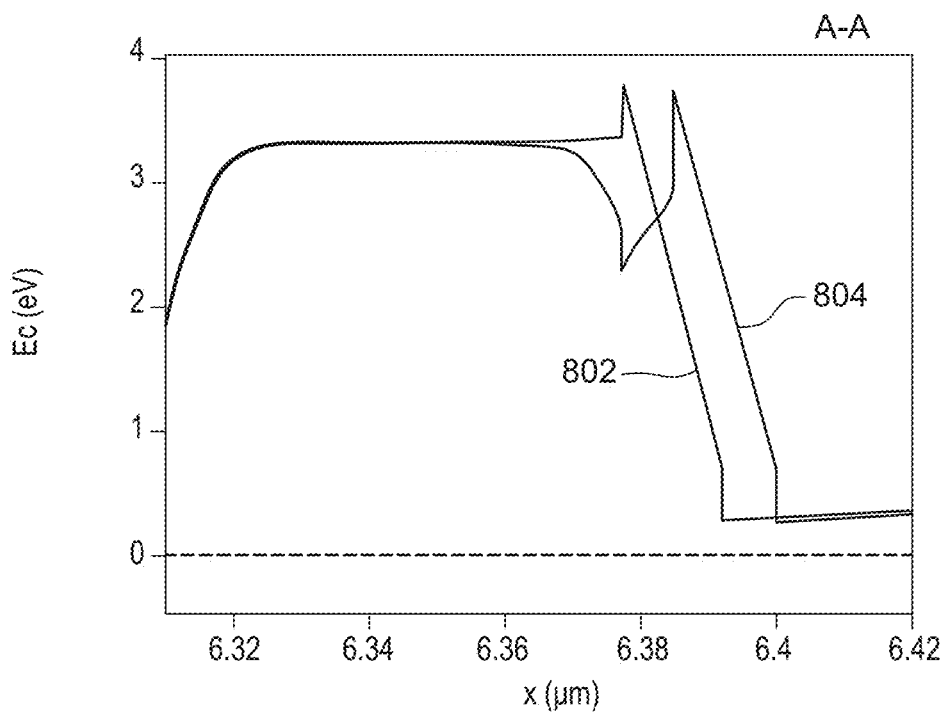
FIG. 8A is a graph representing conduction band energy Ec in line with the gate of the devices of FIGS. 3 and 4A as a function of depth for a gate-source voltage of 0 V.

FIG. 8A is a graph representing conduction band energy Ec in line with the gate of the device 400 of FIG. 4A (curve 802) and of the device 300 of FIG. 3 (curve 804) as a function of depth x for a gate-source voltage of 0 V. In particular, the graph of FIG. 8A corresponds to a cut A-A shown in FIG. 3. The position of the conduction band energy the AlGaN/GaN interface is very similar for the two devices.

Figure 8B:
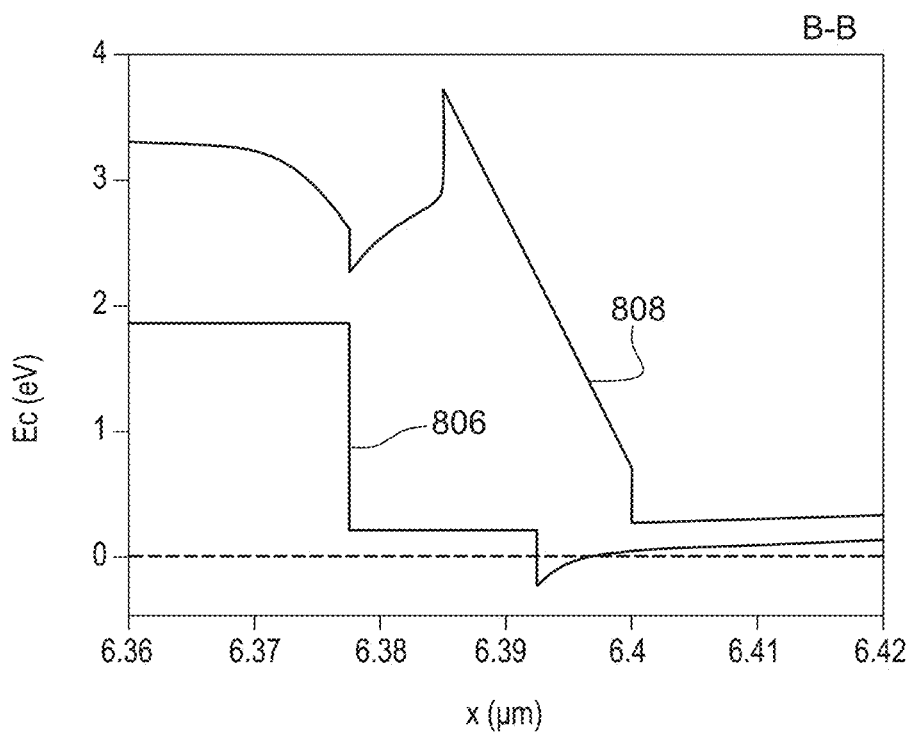
FIG. 8B is a graph representing conduction band energy under a nitride layer of the devices of FIGS. 3 and 4A.

FIG. 8B is a graph representing conduction band energy under the nitride layer 314 of the device 400 of FIG. 4A (curve 806) and of the device 300 of FIG. 3 (curve 808). In particular, the graph of FIG. 8B corresponds to a cut B-B shown in FIG. 3. Here, the p-InGaN layer 320 lifts the conduction band energy at the AlGaN/GaN interface, and leads to 2DEG carrier depletion in the channel.

Figure 9:
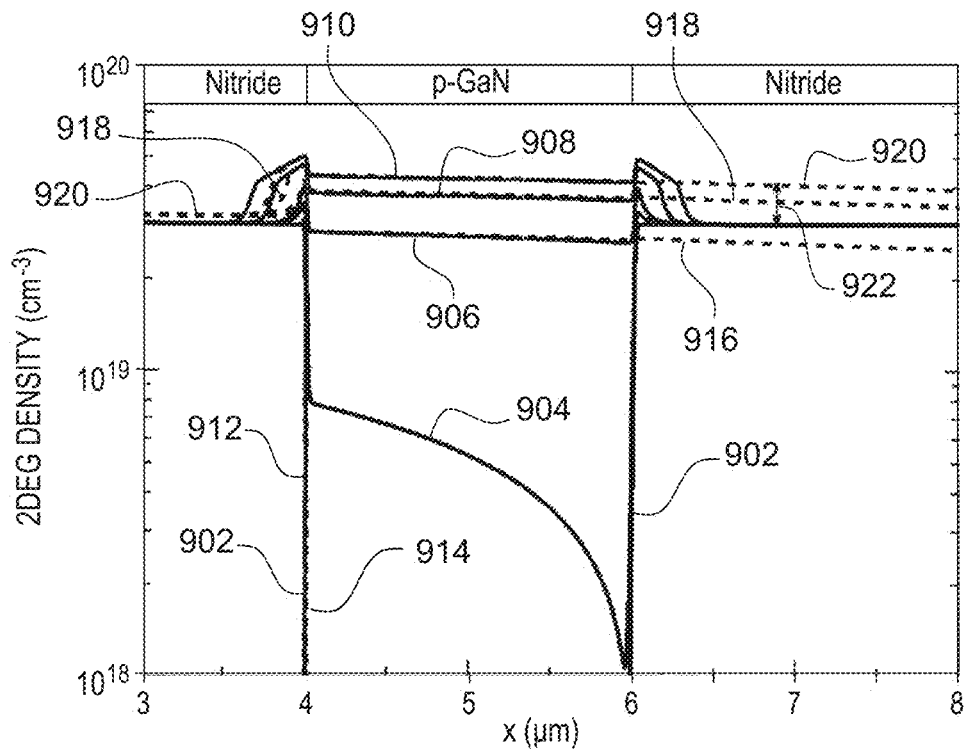
FIG. 9 is a graph representing 2DEG density in a channel of the devices of FIGS. 3 and 4A for five different gate voltages.

FIG. 9 is a graph representing 2-dimensional electron gas density (2DEG DENSITY) in the channel of the device 400 of FIG. 4A for gate voltages of 0 V (solid-line curve 902); +2 V (solid-line curve 904); +4 V (solid-line curve 906); +6 V (solid-line curve 908); and +8 V (solid-line curve 910), and of the device 300 of FIG. 3 for gate voltages of 0 V (dashed-line curve 912 (barely visible behind the dashed curve 914)); +2 V (dashed-line curve 914); +4 V (dashed-line curve 916); +6 V (dashed-line curve 918); and +8 V (dashed-line curve 920).

It can be seen that, at a gate voltage Vgs of 0 V and +2 V, there is a greater 2DEG carrier depletion in the device 300 due to the extended drift region. From a gate voltage Vgs of +6 V and upwards, the 2DEG density in the drift region of the device 300 is higher than that of the device 400 due to the electrostatic effect through hole injection. An arrow 922 in FIG. 9 represents in the 2DEG density increase due to hole injection under the nitride layer 314.

Figure 10A:
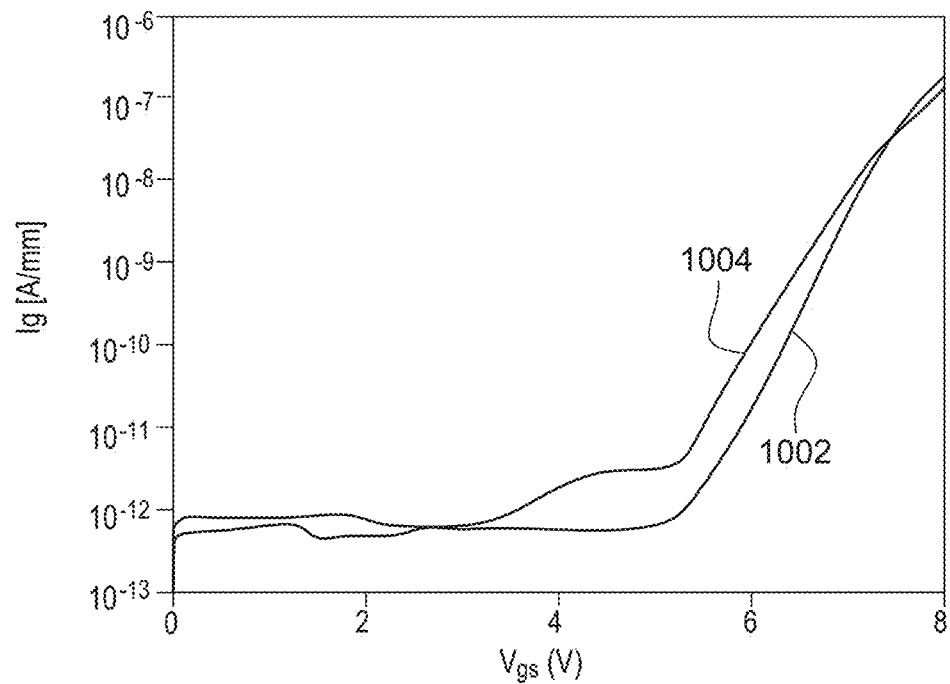
FIG. 10A is a graph representing gate current Ig as a function of gate-source voltage Vgs for the devices of FIGS. 3 and 4A.

FIG. 10A is a graph representing gate leakage current Ig (log scale) as a function of gate-source voltage Vgs for the device 400 of FIG. 4A (curve 1002) and for the device 300 of FIG. 3 (curve 1004). It can be seen that the gate leakage current is slightly reduced in the device 300 with respect to the reference device at relatively high gate voltages of around 8 V.

Figure 10B:
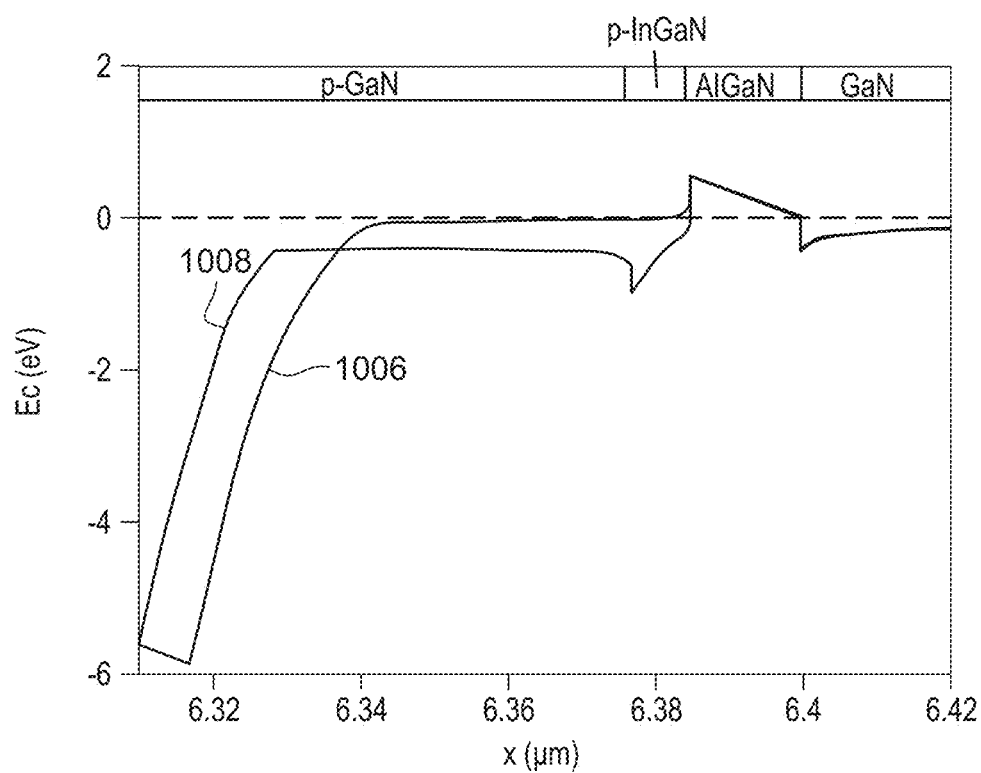
FIG. 10B is a graph representing conduction band energy Ec in line with the gate of the devices of FIGS. 3 and 4A as a function of depth for a gate-source voltage of 8 V.

FIG. 10B is a graph representing conduction band energy Ec in line with the gate of the device 400 of FIG. 4A (curve 1006) and of the device 300 of FIG. 3 (curve 1008) as a function of depth x for a gate-source voltage Vgs of 8 V. In particular, the graph of FIG. 8A corresponds to the cut A-A shown in FIG. 3. The polarization field at the p-InGaN/AlGaN interface leads to a conduction band bending between the p-GaN and p-InGaN layers, and due to this bending, the injected electrons from the channel to the gate metal can reduce at the relatively high gate voltages since some of them can be accumulated at the p-GaN/p-InGaN interface.

The effects of varying the thickness of the p-InGaN layer 320, of varying the Mg doping concentration, of the choice of gate metal, of varying the In mole fraction, and of varying the length of the p-InGaN layer 320, will now be described with reference to FIGS. 11 to 17. Unless stated otherwise, these examples assume an Ni gate, Lpingan of 5 μm and an Mg doping concentration of $1 \times 10^{19}$ cm$^{-3}$.

Figure 11:
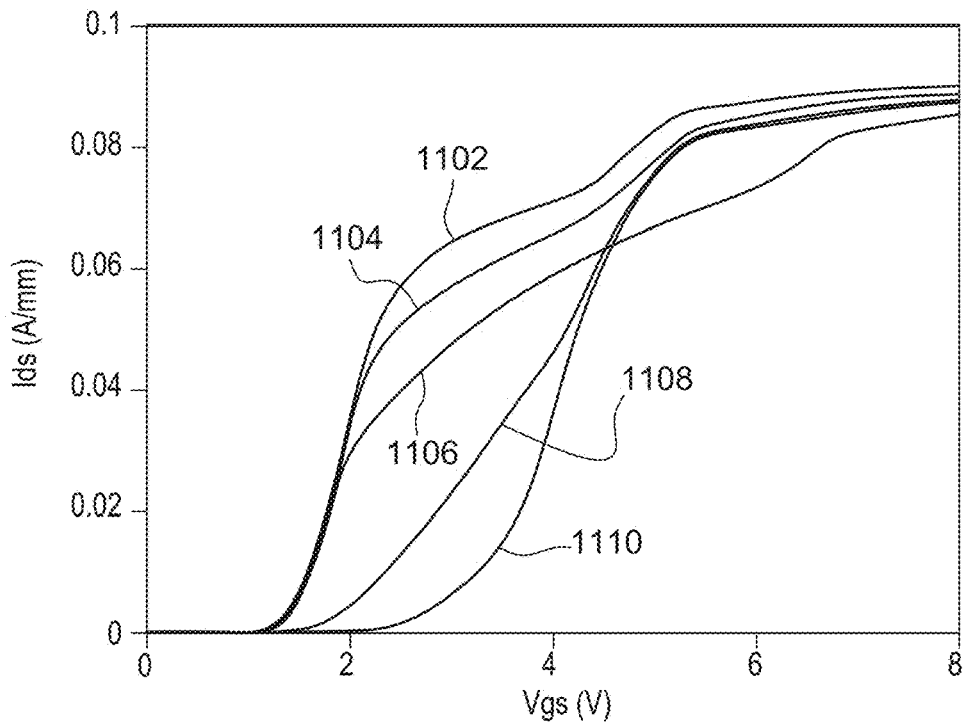
FIG. 11 is a graph representing drain-source current Ids as a function of the gate-source voltage Vgs of the device of FIG. 3 for five different thicknesses of the p-InGaN layer.

FIG. 11 is a graph representing drain-source current Ids as a function of the gate-source voltage Vgs of the device 300 of FIG. 3 for five different thicknesses of the p-InGaN layer 320.

A curve 1102 represents a thickness of 1.0 nm, resulting in a threshold voltage Vth of 1.26 V and a drain current Ids of 89.8 mA/mm.

A curve 1104 represents a thickness of 2.0 nm, resulting in a threshold voltage Vth of 1.29 V and a drain current Ids of 88.6 mA/mm.

A curve 1106 represents a thickness of 3.0 nm, resulting in a threshold voltage Vth of 1.30 V and a drain current Ids of 85.1 mA/mm.

A curve 1108 represents a thickness of 5.0 nm, resulting in a threshold voltage Vth of 1.72 V and a drain current Ids of 87.4 mA/mm.

A curve 1110 represents a thickness of 7.5 nm, resulting in a threshold voltage Vth of 2.45 V and a drain current Ids of 87.1 mA/mm.

It can be seen that the threshold voltage Vth is significantly increased with respect to the reference device (1.45 V) for a thickness of the p-InGaN layer 320 of at least 5 nm. Below this thickness, additional polarization provides additional electrons in the channel due to the p-InGaN layer, which explains the lower threshold voltage Vth with respect to the reference device 400. Furthermore, in order to avoid defect formation between the p-InGaN and AlGaN barrier layer, and strain relaxation, the p-InGaN layer 320 is for example not thicker than 7.5 nm.

Figure 12A:
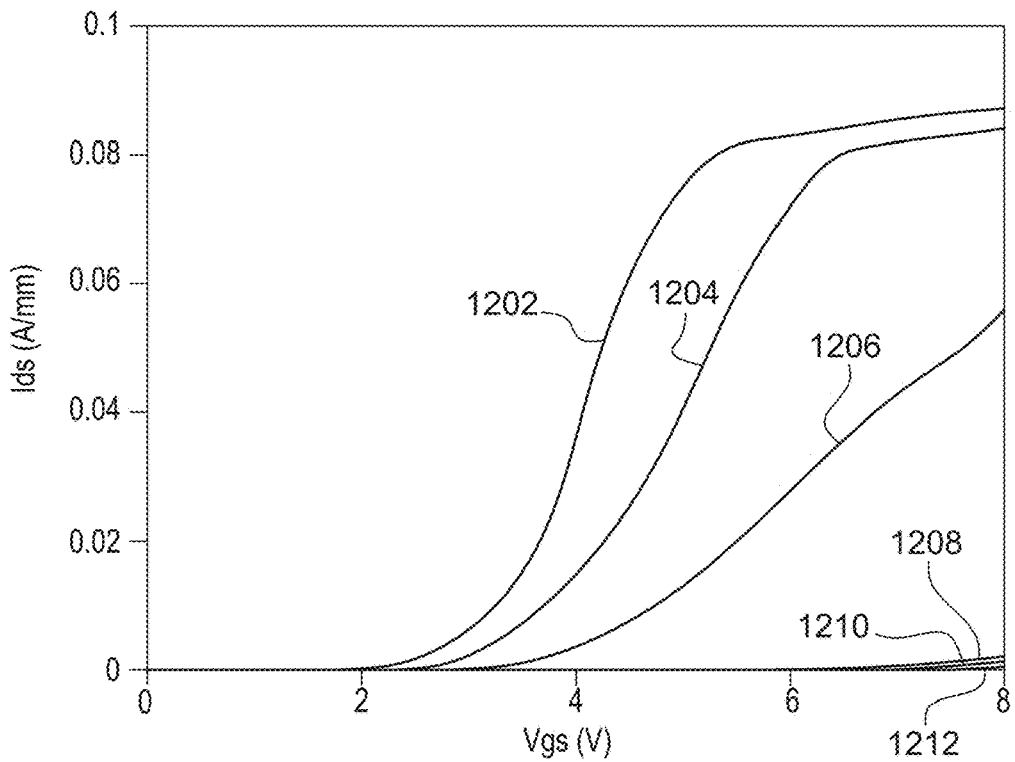
FIG. 12A is a graph representing drain-source current Ids as a function of the gate-source voltage Vgs of the device of FIG. 3 for six different Mg doping concentrations of the p-GaN and p-InGaN layers.

FIG. 12A is a graph representing drain-source current Ids as a function of the gate-source voltage Vgs of the device of FIG. 3 for six different Mg doping concentrations of the p-GaN and p-InGaN layers 316, 320. The layers 316 and 320 for example have the same Mg doping concentration as each other, although in alternative embodiments described below in relation with FIGS. 12B and 12C, they could have different doping concentrations.

A curve 1202 corresponds to an Mg doping concentration of $1 \times 10^{19}$ cm$^{-3}$, resulting in a threshold voltage Vth of 2.45 V, and a drain current Ids of 87.1 mA/mm.

A curve 1204 corresponds to an Mg doping concentration of $7.5 \times 10^{18}$ cm$^{-3}$, resulting in a threshold voltage Vth of 2.8 V, and a drain current Ids of 84.1 mA/mm.

A curve 1206 corresponds to an Mg doping concentration of $5.0 \times 10^{18}$ cm$^{-3}$, resulting in a threshold voltage Vth of 3.50 V, and a drain current Ids of 56.0 mA/mm.

Curves 1208, 1210 and 1212, which are difficult to distinguish from each other in the bottom right corner of the graph, correspond to Mg doping concentrations of $1.0 \times 10^{18}$ cm$^{-3}$, $5.0 \times 10^{17}$ cm$^{-3}$ and $1.0 \times 10^{17}$ cm$^{-3}$ respectively.

For Mg doping concentrations of less than $5 \times 10^{18}$ cm$^{-3}$, it was found that the device did not turn on due to negative polarization charges at the p-InGaN/AlGaN interface causing a depletion of carriers in the channel below the p-GaN and drift region. Therefore, Mg doping concentrations greater than $5 \times 10^{18}$ cm$^{-3}$ are for example used in order to obtain hole injection.

It can be seen that providing an Mg doping concentration of at least $7.5 \times 10^{18}$ cm$^{-3}$ results in a reasonable drain current. The Mg doping concentration is for example not higher that around $1 \times 10^{19}$ cm$^{-3}$ for the p-GaN layer 316 and the p-InGaN layer 320 because it may be hard to activate Mg in the case of higher Mg concentrations and thick p-type layers, see for example the publication by N. Tetsuo et al., J. Appl. Phys. 124 (16) 165706 (2018); N. E. Posthuma et al. ISPSD 2016 pp. 95-98.

Figure 12B:
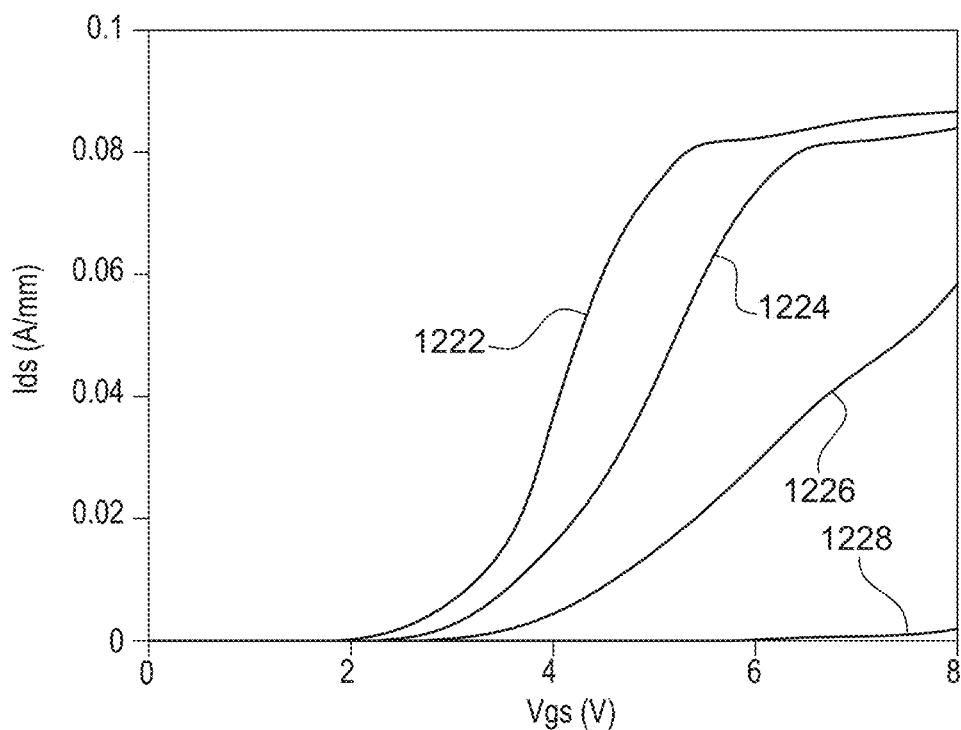
FIG. 12B is a graph representing drain-source current Ids as a function of the gate-source voltage Vgs of the device of FIG. 3 for four different Mg doping concentrations of the p-GaN layer.

FIG. 12B is a graph representing drain-source current Ids as a function of the gate-source voltage Vgs of the device of FIG. 3 for four different Mg doping concentrations of the p-GaN layer 316, while the p-InGaN layer 320 for example has an Mg doping concentration of $1 \times 10^{19}$ cm$^{-3}$. In particular, the curves 1222, 1224, 1226 and 1228 in FIG. 12B respectively correspond to Mg doping concentrations of $1.0 \times 10^{19}$ cm$^{-3}$, $7.5 \times 10^{18}$ cm$^{-3}$, $5.0 \times 10^{18}$ cm$^{-3}$ and $1.0 \times 10^{18}$ cm$^{-3}$.

Figure 12C:
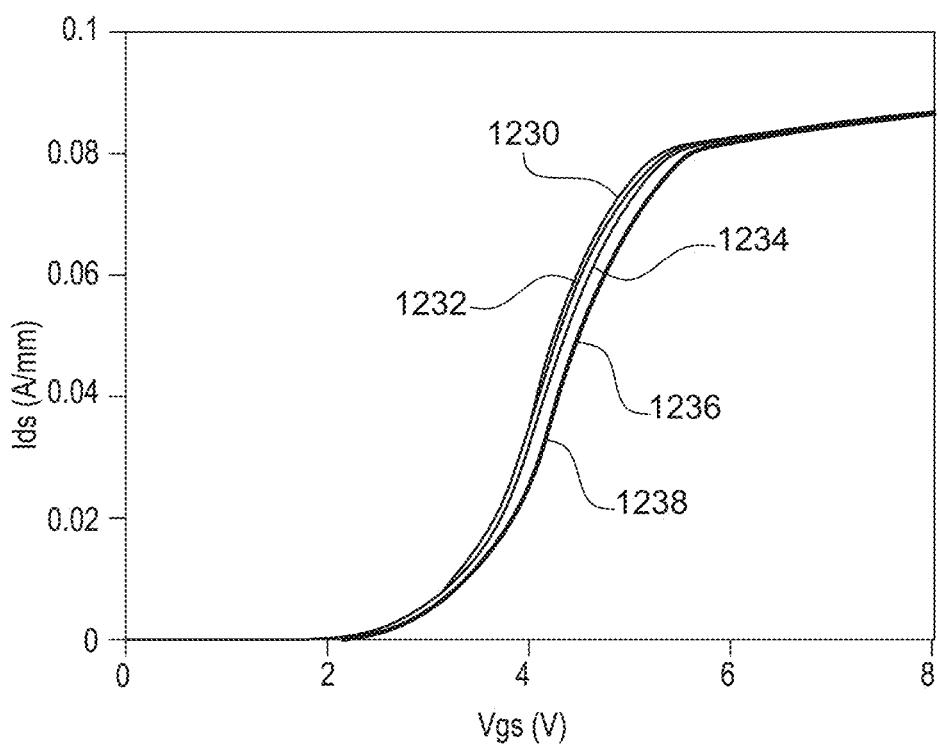
FIG. 12C is a graph representing drain-source current Ids as a function of the gate-source voltage Vgs of the device of FIG. 3 for five different Mg doping concentrations of the p-InGaN layer.

FIG. 12C is a graph representing drain-source current Ids as a function of the gate-source voltage Vgs of the device of FIG. 3 for five different Mg doping concentrations of the p-InGaN layer, while the p-GaN layer 320 for example has an Mg doping concentration of $1 \times 10^{19}$ cm$^{-3}$. In particular, the curves 1230, 1232, 1234, 1236 and 1238 in FIG. 12C respectively correspond to Mg doping concentrations of $1.0 \times 10^{19}$ cm$^{-3}$, $7.5 \times 10^{18}$ cm$^{-3}$, $5.0 \times 10^{18}$ cm$^{-3}$, $1.0 \times 10^{18}$ cm$^{-3}$ and $5.0 \times 10^{17}$ cm$^{-3}$.

It can be seen from FIGS. 12B and 12C that the use of different Mg doping concentrations between the layers 316 and 320 does not have a significant impact on the threshold voltage Vth with respect to using the same Mg doping concentration in each layer 316, 320.

Figure 13:
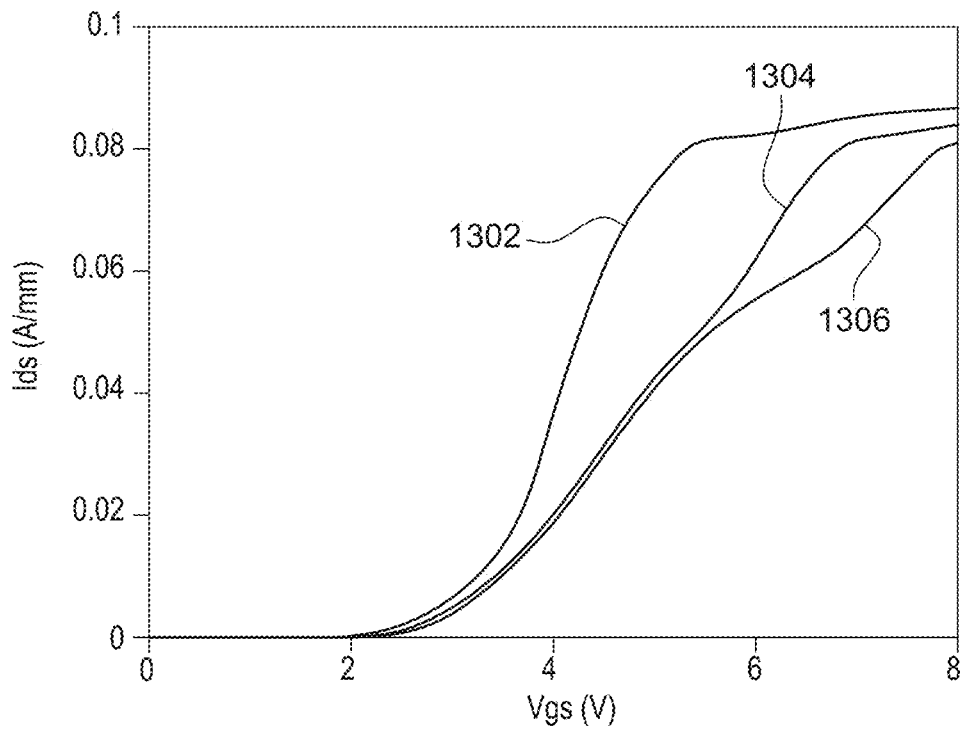
FIG. 13 is a graph representing drain-source current Ids as a function of the gate-source voltage Vgs of the device of FIG. 3 for gate metals formed of Ni, TiN and W.

FIG. 13 is a graph representing drain-source current Ids as a function of the gate-source voltage Vgs of the device of FIG. 3 for gate metals formed of Ni, TiN and W.

In the case of Ni (curve 1302), which has a metal workfunction of 5.2 eV, the threshold voltage was 2.45 V, and the drain current was 87.1 mA/mm.

In the case of TiN (curve 1304), which has a metal workfunction of 4.8 eV, the threshold voltage was 2.60 V, and the drain current was 84.0 mA/mm.

In the case of W (curve 1306), which has a metal workfunction of 4.6 eV, the threshold voltage was 2.68 V, and the drain current was 81.0 mA/mm.

All of these metals were found to have acceptable performance, the metals TiN and W being particularly adapted to applications where a high gate voltage, for example of 8 V or more, is to be used.

Figure 14:
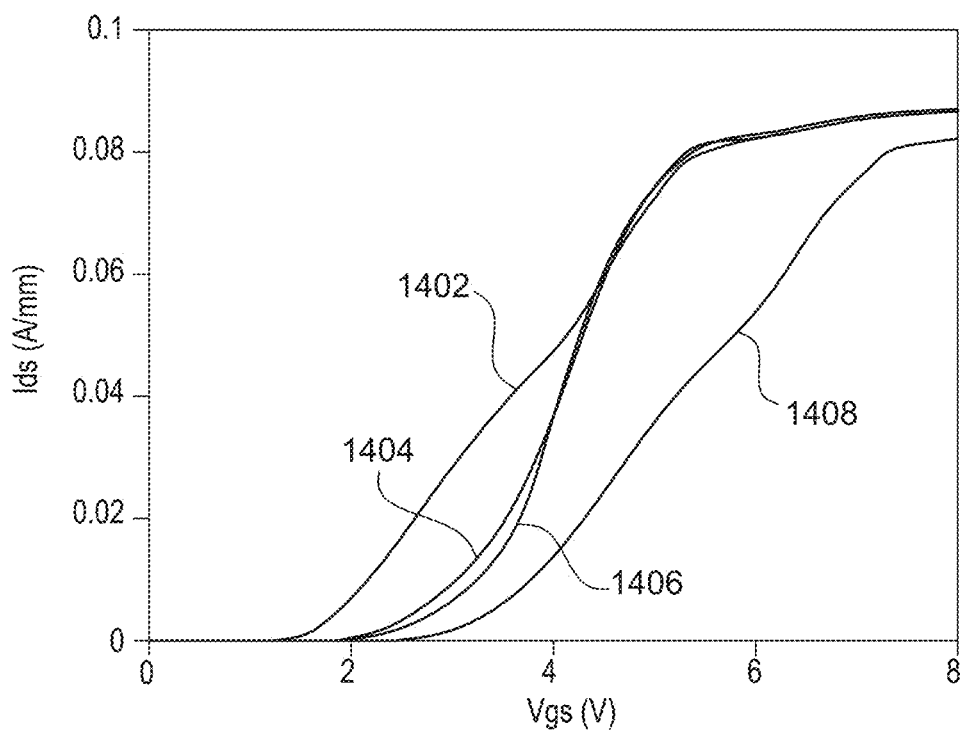
FIG. 14 is a graph representing drain-source current Ids as a function of the gate-source voltage Vgs of the device of FIG. 3 for four different mole fractions of In in the p-InGaN layer.

FIG. 14 is a graph representing drain-source current Ids as a function of the gate-source voltage Vgs of the device 300 of FIG. 3 for four different mole fractions of In in the p-InGaN layer 320, and for a drain-source voltage Vds of +1 V.

A curve 1402 corresponds to an In mole fraction of 0.05, resulting in a threshold voltage Vth of 1.56 V and a drain current Ids at Vgs=+8 V of 87.3 mA/mm.

A curve 1404 corresponds to an In mole fraction of 0.10, resulting in a threshold voltage Vth of 2.20 V and a drain current Ids at Vgs=+8 V of 87.6 mA/mm.

A curve 1406 corresponds to an In mole fraction of 0.15, resulting in a threshold voltage Vth of 2.45 V and a drain current Ids at Vgs=+8 V of 87.1 mA/mm.

A curve 1408 corresponds to an In mole fraction of 0.20, resulting in a threshold voltage Vth of 2.85 V and a drain current Ids at Vgs=+8 V of 83.0 mA/mm.

Thus, the In mole fraction provides a means of setting the threshold voltage Vth of the HEMT device. Increasing the In mole fraction in the p-InGaN layer 320 increases the threshold voltage Vth due to increased 2DEG depletion in the access region. In the case of an In mole fraction of 0.05, positive charges at the p-InGaN/AlGaN interface are not sufficient to deplete 2DEG electrons in the channel, resulting in a threshold voltage Vth close to that of the reference device. Furthermore, the presence of positive charges at the interface leads to current saturation at higher gate voltages, due to conductivity modulation through the hole injection.

In some embodiments, the In mole fraction is selected to be of at least 0.10, and for example in the range 0.10 to 0.20.

Figure 15A:
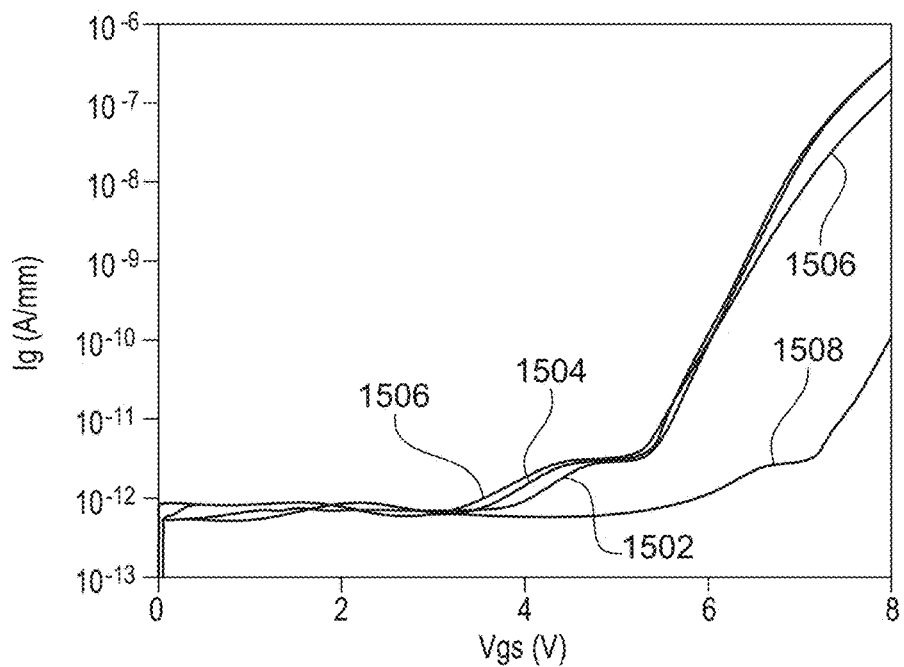
FIG. 15A is a graph representing gate current Ig as a function of the gate-source voltage Vgs of the device of FIG. 3 for four different mole fractions of In in the p-InGaN layer.

FIG. 15A is a graph representing gate current Ig as a function of the gate-source voltage Vgs of the device 300 of FIG. 3 for the same four difference mole fractions of In in the p-InGaN layer as in FIG. 14, a curve 1502 corresponding to y=0.05, a curve 1504 to y=0.10, a curve 1506 to y=0.15 and a curve 1508 to y=0.20. The drain-source voltage Vds is +1 V.

In the case of the In mole fraction of 0.20, gate leakage current is lower than the other cases. In some embodiments, the In mole fraction is chosen to be at most 0.15 or 0.20. For example, the use of In content higher than 0.20 in the InGaN layer 320 may cause a formation of In droplets in the heterostructure, which degrades crystal quality. An In mole fraction of up to 0.20 is beneficial in terms of leakage current, if for example In droplet formation can be avoided during the growth for the given application.

Figure 15B:
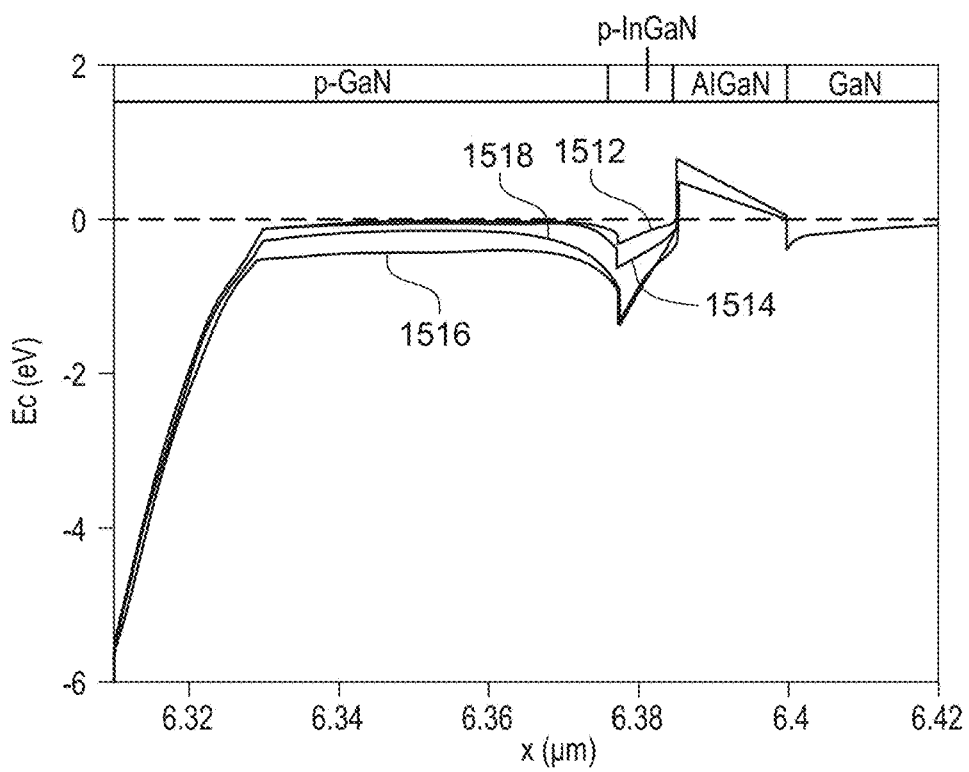
FIG. 15B is a graph representing conduction band energy Ec in line with the gate of the device of FIG. 3 as a function of depth for four different mole fractions of In in the p-InGaN layer.

FIG. 15B is a graph representing conduction band energy Ec in line with the gate of the device 300 of FIG. 3, corresponding to the cut A-A shown in FIG. 3, as a function of depth for the same four difference mole fractions of In in the p-InGaN layer as in FIG. 14, a curve 1512 corresponding to y=0.05, a curve 1514 to y=0.10, a curve 1516 to y=0.15 and a curve 1518 to y=0.20. The gate-source voltage Vgs is +8 V.

Increased polarization field leads to a deeper quantum well at the p-GaN/p-InGaN interface and increases the potential barrier at the p-InGaN/AlGaN interface. Due to higher barrier height, electron injection from the channel to the gate metal 318 decreases, leading to lower leakage current. On the other hand, deeper band bending at the p-GaN/p-InGaN interface helps to reduce the leakage current due to some injected electrons that may be accumulated.

FIGS. 16A to 16D represent the effect of varying the length Lpingan of the p-InGaN layer 320. All of these examples, except those of FIG. 16D, assume a constant spacing between the source 308 and drain 310 of the device of 14 μm, a spacing between the source 308 and the gate of 2 μm, and a gate length of 2 μm.

Figure 16A:
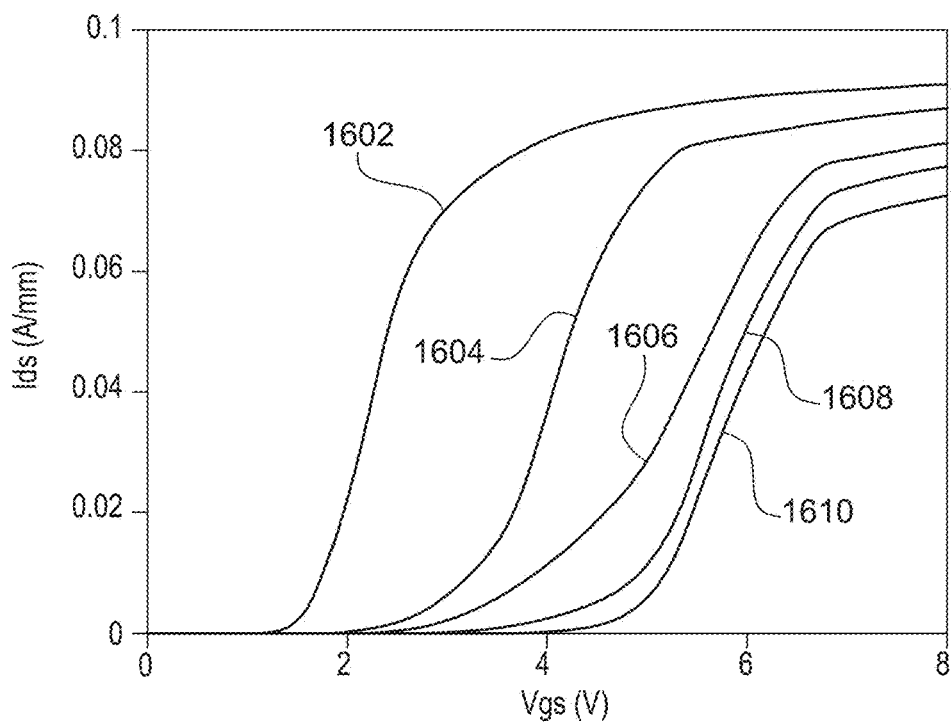
FIG. 16A is a graph representing drain-source current Ids as a function of the gate-source voltage Vgs of the device of FIG. 4A, and of the device of FIG. 3 for four different lengths of the p-InGaN layer.

FIG. 16A is a graph representing drain-source current Ids as a function of the gate-source voltage Vgs of the device 400 of FIG. 4A (curve 1602), and of the device 300 of FIG. 3 for four different lengths of the p-InGaN layer (curves 1604 to 1610), all for a drain-source voltage Vds=+1 V.

The curve 1604 corresponds to a length of 5.0 μm, and the threshold voltage Vth was 2.45 V, and the drain-source current Ids at Vgs=+8 V was 87.1 mA/mm.

The curve 1606 corresponds to a length of 6.0 μm, and the threshold voltage Vth was 2.80 V, and the drain-source current Ids at Vgs=+8 V was 81.6 mA/mm.

The curve 1608 corresponds to a length of 8.0 μm, and the threshold voltage Vth was 3.60 V, and the drain-source current Ids at Vgs=+8 V was 77.7 mA/mm.

The curve 1610 corresponds to a length of 10.0 μm, and the threshold voltage Vth was 4.50 V, and the drain-source current Ids at Vgs=+8 V was 72.9 mA/mm.

It can be seen that the effect of increasing the length of the p-InGaN layer 320 is to increase the threshold voltage Vth.

In some embodiments, the p-InGaN layer 320 has a length of at least 6 μm, and/or extends beyond the edge of the gate stack 312 by at least 4 μm, such that the threshold voltage Vth is for example higher than around 2.0 V. In some embodiments, there is a spacing of at least 4 μm between the p-InGaN layer 320 and the drain 310.

Figure 16B:
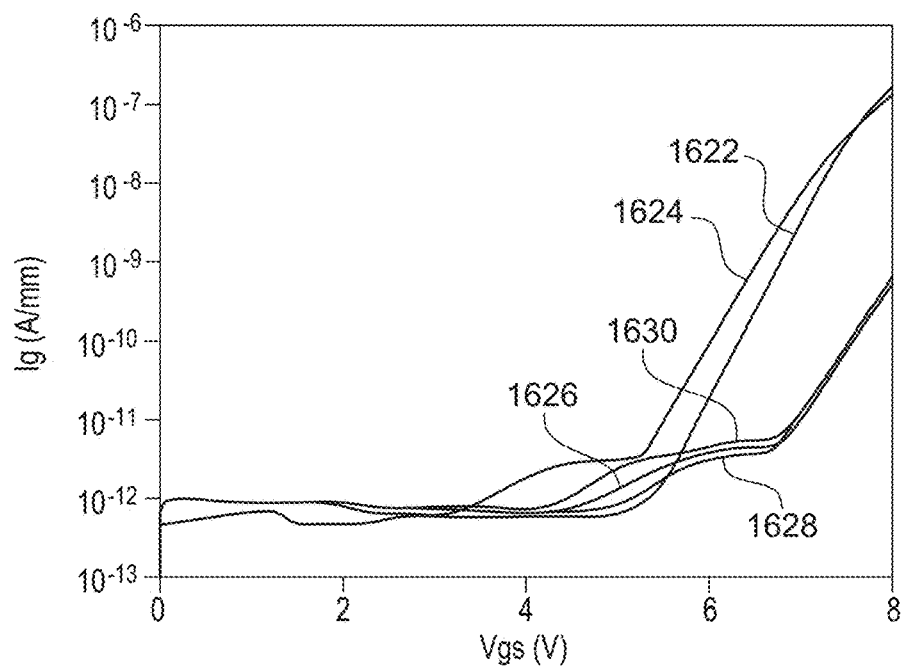
FIG. 16B is a graph representing gate current Ig as a function of the gate-source voltage Vgs of the device of FIG. 4A, and of the device of FIG. 3 for four different lengths of the p-InGaN layer.

FIG. 16B is a graph representing gate current Ig as a function of the gate-source voltage Vgs of the device 400 of FIG. 4A (curve 1622), and of the device 300 of FIG. 3 for the same four lengths of the p-InGaN layer as of FIG. 16A. In particular, a curve 1624 represents the case of Lpingan=5.0 μm, a curve 1626 represents the case of Lpingan=6.0 μm, a curve 1628 represents the case of Lpingan=8.0 μm, and a curve 1630 represents the case of Lpingan=10.0 μm. It can be seen that the current leakage is substantially the same, irrespective of the length Lpingan.

Figure 16C:
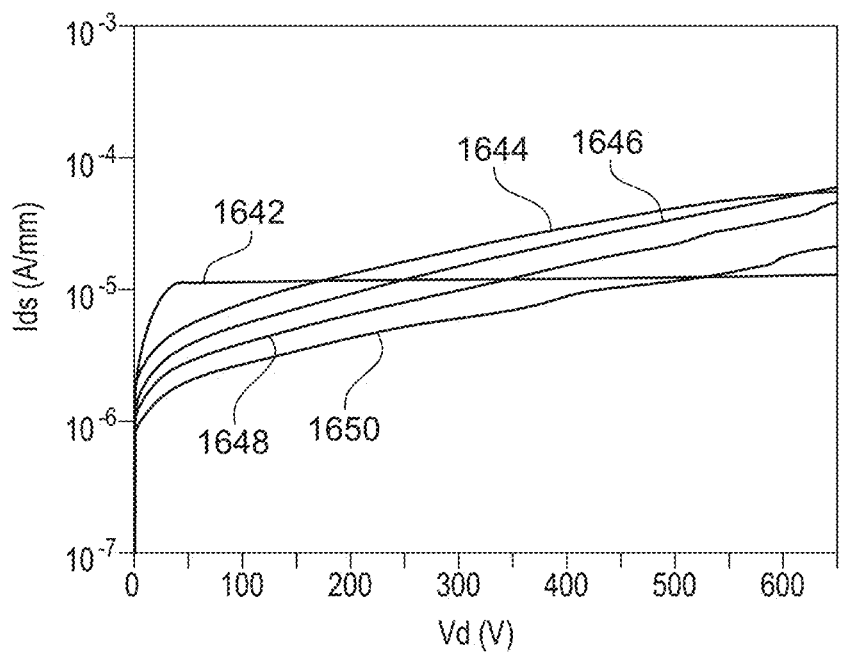
FIG. 16C is a graph representing off-state current Ioff as a function of the drain voltage Vd of the device of FIG. 4A, and of the device of FIG. 3 for four different lengths of the p-InGaN layer.

FIG. 16C is a graph representing an off-state drain-source current Ids as a function of the drain voltage Vd of the device 400 of FIG. 4A (curve 1642), and of the device 300 of FIG. 3 for the same four lengths of the p-InGaN layer as of FIG. 16A, for a gate-source voltage Vgs of 0 V. A curve 1644 represents the case of Lpingan=5 μm, a curve 1646 represents the case of Lpingan=6 μm, a curve 1648 represents the case of Lpingan=8 μm, and a curve 1650 represents the case of Lpingan=10 μm.

It can be seen that the current leakage in the transistor off state is higher for the shorter lengths of the p-InGaN layer 320, but represent an improvement with respect to the reference device 400 for drain voltages up to around 250 V, or up to around 500 V in the case that the length of the p-InGaN layer 320 is of at least 10 μm.

Figure 16D:
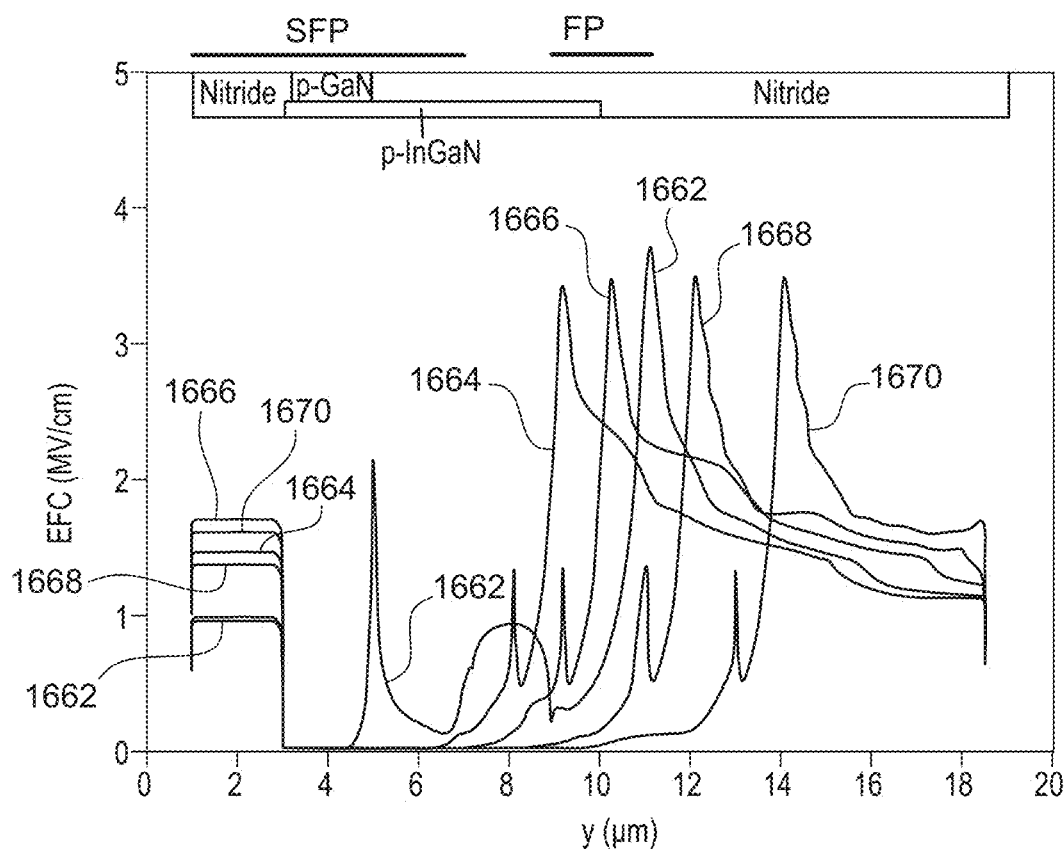
FIG. 16D is a graph representing an electric field EF in the channel as a function of distance from the source for the device of FIG. 4A, and for the device of FIG. 3 for four different lengths of the p-InGaN layer, in the case that the device has a source field plate SFP and a field plate FP.

FIG. 16D is a graph representing an electric field EF in the channel as a function of distance y from the source for the device 400 of FIG. 4A (curve 1662), and for the device 300 of FIG. 3 for the same four lengths of the p-InGaN layer as of FIG. 16A, for a drain-source voltage Vds of +650 V. The example of FIG. 16D assumes the devices have a source field plate SFP and a field plate FP, as will be described in more detail below with reference to FIG. 17. A curve 1664 represents the case of Lpingan=5.0 μm, a curve 1666 represents the case of Lpingan=6.0 μm, a curve 1668 represents the case of Lpingan=8.0 μm, and a curve 1670 represents the case of Lpingan=10.0 μm. The electric field distributions in the channel as demonstrated by FIG. 16D show that, within the range of lengths of Lpingan, the device described herein operates safely for 650 V applications.

Figure 17:
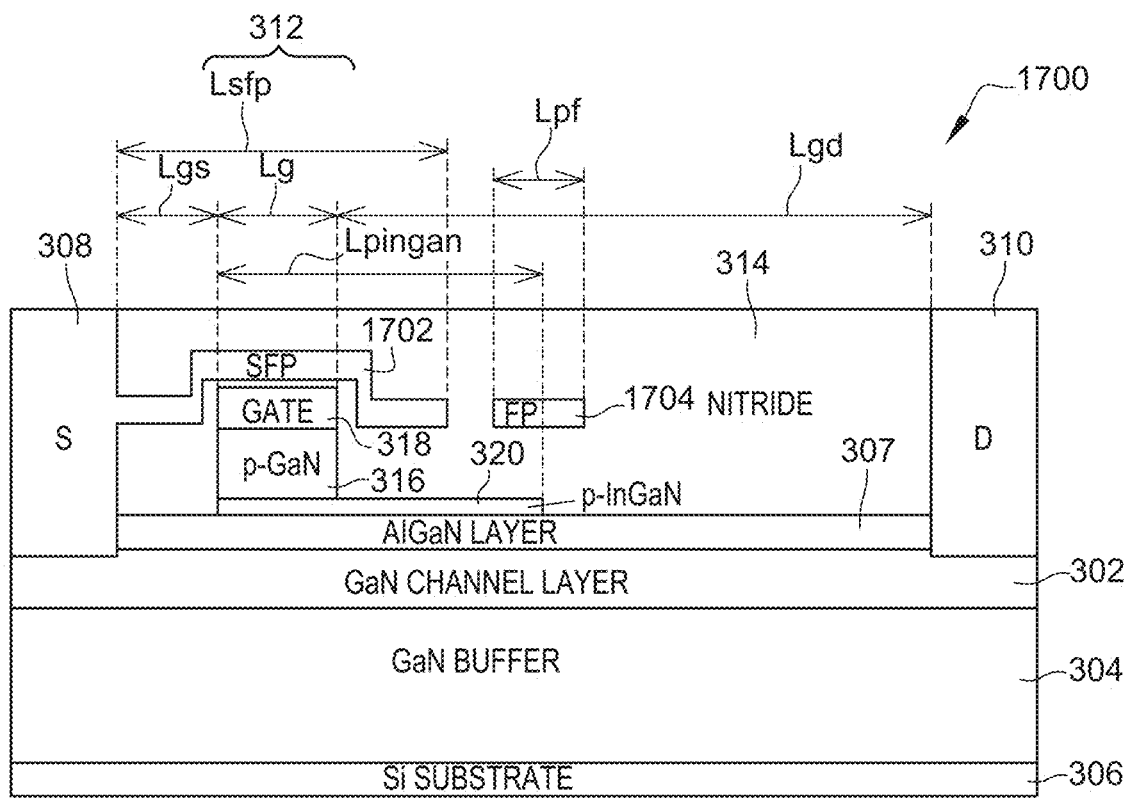
FIG. 17 is a cross-section view of an HEMT device similar to the one of FIG. 3 but additionally comprising a source field plate SFP and a field plate FP according to an example embodiment of the present disclosure.

FIG. 17 is a cross-section view of an HEMT device 1700 that is similar to the one of FIG. 3, and like features are labelled with like reference numerals. The device 1700 additionally comprises a source field plate SFP 1702 extending from the source 308 of the device, and a field plate FP 1704.

The source field plate 1702 and the field plate 1704 are for example for applications where the drain voltage will be of 200 V or more. Each field plate 1702, 1704 for example has a thickness of between 0.10 μm and 0.30 μm, and for example of substantially 0.20 μm. The source field plate 1702 and field plate 1704 are for example formed of the same material as that of the source.

The source field plate 1702 for example extends from the source 308 and over the gate metal 318, a separation between the gate metal 318 and the plate 1702 for example being at least 0.10 μm, and for example of substantially 0.15 μm. In some embodiments, the source field plate 1702 is at a level below the top of the gate metal 318 on each side of the gate stack 312, and rises above the gate metal 318 in the vicinity of the gate stack 312 to maintain the spacing. A length Lsfp of the source field plate is for example of 6.0 μm in the example of FIG. 17, in which the gate length Lg is for example of 2.0 μm, and the spacing Lgs between the source 308 and the gate stack is also of 2.0 μm. A spacing Lgd between the gate stack 312 and the drain 310 is for example of 13.5 μm in the example of FIG. 17. More generally, the source field plate 1702 for example extends beyond the gate stack 312 on the drain side by between 1.0 μm and 4.0 μm.

The field plate 1704 is for example centered on an edge of the p-InGaN layer 320 closest to the drain, and in the example of FIG. 17 has a length Lfp of 2.0 μm. More generally, the field plate 1704 for example has a length of between 1.0 μm and 4.0 μm.

An advantage of the embodiments described herein is that the HEMT device is able to have a relatively high threshold voltage Vth, while maintaining a relatively high drain current.

Various embodiments and variants have been described. Those skilled in the art will understand that certain features of these embodiments can be combined and other variants will readily occur to those skilled in the art. In particular, it will be apparent to those skilled in the art that, while particular examples of dimensions of the various features of the HEMT devices have been provided, these dimensions could be varied.

Finally, the practical implementation of the embodiments and variants described herein is within the capabilities of those skilled in the art based on the functional description provided hereinabove.

The invention claimed is:

1. A transistor device comprising:
   a layer of aluminum gallium nitride (AlGaN) extending between a source and a drain of the device;
   a gallium nitride (GaN) channel layer extending under the layer of AlGaN;
   a gate stack comprising a layer of p-doped GaN; and
   a layer of p-doped indium gallium nitride (InGaN) of at least 5 nm in thickness positioned between the layer of AlGaN and the layer of p-doped GaN, the layer of p-doped InGaN having a length greater than a length of the gate stack and of the layer of p-doped GaN,
   wherein a drain-side edge of the layer of p-doped InGaN is separated from the drain and/or a source-side edge of the layer of p-doped InGaN is separated from the source.

2. The transistor device of claim 1, wherein the length of the layer of p-doped InGaN is of at least 6 μm.

3. The transistor device of claim 1, wherein the layer of p-doped InGaN has an Mg doping concentration of at least $5 \times 10^{18}$ cm$^{-3}$.

4. The transistor device of claim 3, wherein the layer of p-doped InGaN has an Mg doping concentration of less than $1 \times 10^{19}$ cm$^{-3}$.

5. The transistor device of claim 1, wherein the layer of p-doped InGaN has an In mole faction of at least 0.05.

6. The transistor device of claim 1, wherein the layer of p-doped InGaN extends beyond a drain-side edge of the gate stack by at least 2.0 μm, the layer of p-doped InGaN being aligned on a side of the source with a source edge of the gate stack.

7. The transistor device of claim 1, wherein the drain-side edge of the layer of p-doped InGaN is separated from the drain by a spacing of at least 4.0 μm.

8. The transistor device of claim 1, wherein the gate stack comprises a gate metal of Ni, W, or TiN.

9. The transistor device of claim 1, wherein the layer of p-doped InGaN has a thickness of 7.5 nm or less.

10. The transistor device of claim 1, comprising a source field plate extending from the source over the gate stack.

11. An integrated circuit comprising at least one transistor device according to claim 1.

12. The transistor device of claim 1, wherein the layer of p-doped InGaN has an Mg doping concentration of at least $7.5 \times 10^{18}$ cm$^{-3}$.

13. The transistor device of claim 1, wherein the layer of p-doped InGaN has an In mole faction of between 0.10 and 0.20.

* * * * *

UNITED STATES PATENT AND TRADEMARK OFFICE
CERTIFICATE OF CORRECTION

PATENT NO. : 12,154,982 B2  
APPLICATION NO. : 17/496699  
DATED : November 26, 2024  
INVENTOR(S) : Gökhan Atmaca Page 1 of 1

It is certified that error appears in the above-identified patent and that said Letters Patent is hereby corrected as shown below:

In the Claims

Claim 6, Column 12, Lines 45-49:
"The transistor device of claim 1, wherein the layer of p-doped InGaN extends beyond a drain-side edge of the gate stack by at least 2.0 µm, the layer of p-doped InGaN being aligned on a side of the source with a source edge of the gate stack."

Should read:
--The transistor device of claim 1, wherein the layer of p-doped InGaN extends beyond a drain-side edge of the gate stack by at least 2.0 µm, the layer of p-doped InGaN being aligned on a side of the source with a source-side edge of the gate stack.--

Signed and Sealed this  
Eleventh Day of March, 2025

Coke Morgan Stewart  
*Acting Director of the United States Patent and Trademark Office*